United States Patent
Okamoto et al.

(10) Patent No.: US 9,581,426 B2
(45) Date of Patent: Feb. 28, 2017

(54) MAGNETIC FIELD MEASURING DEVICE

(75) Inventors: Junichiro Okamoto, Tokyo (JP); Arata Takahashi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 495 days.

(21) Appl. No.: 14/233,411

(22) PCT Filed: Jul. 27, 2012

(86) PCT No.: PCT/JP2012/004813
§ 371 (c)(1),
(2), (4) Date: Jan. 17, 2014

(87) PCT Pub. No.: WO2013/018347
PCT Pub. Date: Feb. 7, 2013

(65) Prior Publication Data
US 2014/0156220 A1   Jun. 5, 2014

(30) Foreign Application Priority Data

Jul. 29, 2011 (JP) ................... 2011-166635

(51) Int. Cl.
*G01D 5/14* (2006.01)
*G01B 7/14* (2006.01)
(Continued)

(52) U.S. Cl.
CPC .............. *G01B 7/14* (2013.01); *G01D 5/145* (2013.01); *G01D 5/2451* (2013.01); *G01R 33/072* (2013.01)

(58) Field of Classification Search
CPC ...................................................... G01D 5/145
(Continued)

(56) References Cited

U.S. PATENT DOCUMENTS 6,097,183 A * 8/2000 Goetz ................... G01D 5/145
                                                      324/207.12
2002/0021124 A1   2/2002 Schott et al.
(Continued)

FOREIGN PATENT DOCUMENTS

| JP | 2002-328046 A | 11/2002 |
| JP | 2003-294818 A | 10/2003 |

(Continued)

OTHER PUBLICATIONS

Japanese Office Action dated May 27, 2014.
(Continued)

*Primary Examiner* — Bryan Bui
(74) *Attorney, Agent, or Firm* — Morgan, Lewis & Bockius LLP

(57) ABSTRACT

The present invention provides a magnetic field measuring device comprising first to fourth magnetoelectric transducers, magnetic convergence plates, and a calculation unit that calculates the strength of a magnetic field applied in a horizontal direction and/or a vertical direction with respect to a magneto-sensing surface of the magnetoelectric transducers, wherein the magnetic convergence plates are placed in the vicinity of the first to fourth magnetoelectric transducers so as to convert magnetic field vectors, and the calculation unit includes a first calculation block that adds or subtracts output from the first to fourth magnetoelectric transducers, and outputs a calculation result.

15 Claims, 18 Drawing Sheets

(51) Int. Cl.
*G01R 33/07* (2006.01)
*G01D 5/245* (2006.01)

(58) Field of Classification Search
USPC .......................................................... 702/150
See application file for complete search history.

(56) References Cited

U.S. PATENT DOCUMENTS

| | | |
|---|---|---|
| 2002/0167306 A1 | 11/2002 | Zalunardo et al. |
| 2007/0080676 A1 | 4/2007 | Racz et al. |
| 2009/0174395 A1 | 7/2009 | Thomas et al. |
| 2009/0315543 A1 | 12/2009 | Guo et al. |
| 2011/0133724 A1 | 6/2011 | Fukuoka et al. |

FOREIGN PATENT DOCUMENTS

| | | |
|---|---|---|
| JP | 2008-304470 A | 12/2008 |
| JP | 2009-150732 A | 7/2009 |
| JP | 2011-059103 A | 3/2011 |
| JP | 2011-508891 A | 3/2011 |
| JP | 2011-137796 | 7/2011 |
| WO | 2009/088767 A2 | 7/2009 |
| WO | 2010/008465 A1 | 1/2010 |

OTHER PUBLICATIONS

International Search Report issued in corresponding International Patent Application No. PCT/JP2012/004813 dated Oct. 23, 2012.
Search Report dated Dec. 3, 2014, issued by the European Patent Office in European Patent Application No. 12820604.2.
International Preliminary Report on Patentability and Written Opinion issued in corresponding International Patent Application No. PCT/JP2012/004813 dated Feb. 13, 2014.

\* cited by examiner

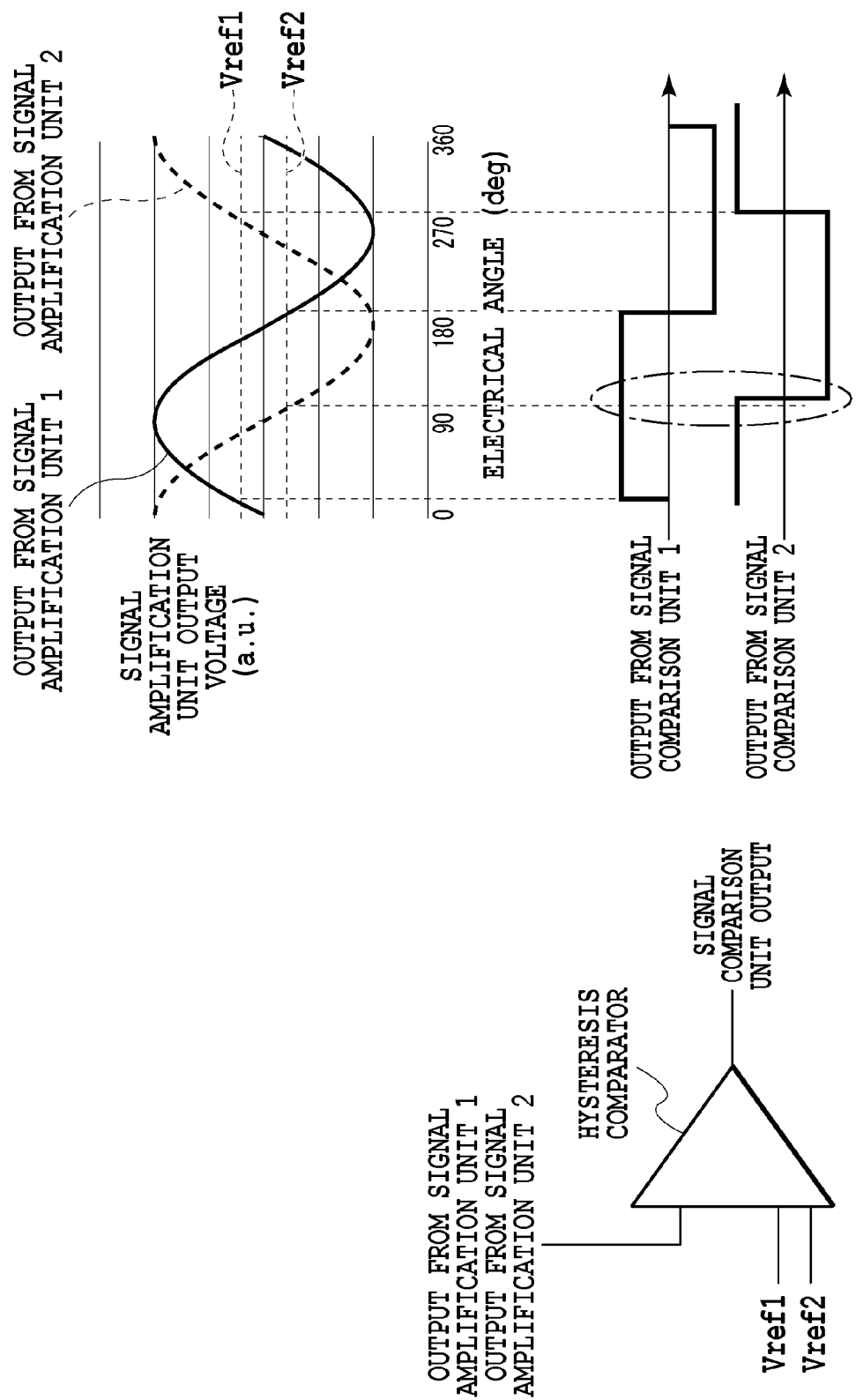

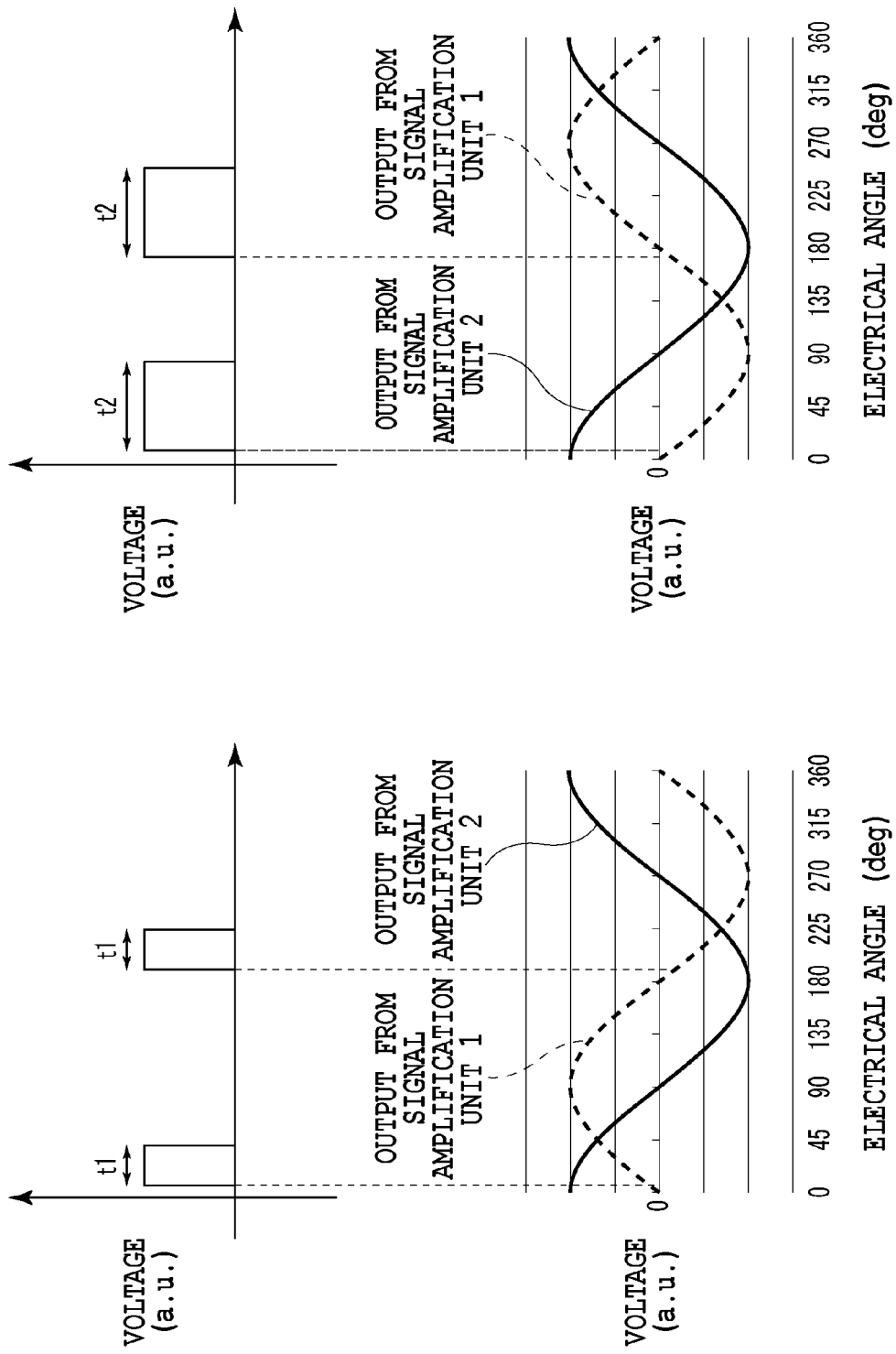

MAGNETIC FIELD MEASURING DEVICE

TECHNICAL FIELD

The present invention relates to a magnetic field measuring device, and more particularly, to a magnetic field measuring device that detects the position, move, or rotation of a magnetic field-producing body.

BACKGROUND ART

FIGS. 1A to 1C are diagrams for explaining a traditional magnetic encoder, in which a multipolar magnet and magnetic sensors such as Hall ICs as illustrated in FIG. 1A are used. In this case, Hall ICs 102a and 102b are placed such that the phase difference between each other's output pulses are offset by an electrical angle of 90 degrees. By taking such a configuration, it is possible to make a magnetic encoder able to detect a rotational direction.

FIG. 2 is a block diagram of a Hall IC in general use, in which a Hall element 101, an amp 130, and a Schmitt circuit 131 are integrated. Such a Hall IC is broadly used in fields such as magnetic pulse encoders. The Hall IC operates to amplify the Hall electromotive force output in proportion to a magnetic field applied to the magneto-sensing surface of the Hall element 101 at the amp 130, subsequently make a comparison against an arbitrary threshold at the Schmitt circuit, and digitally output the result.

Next, the principle of a magnetic encoder capable of detecting direction will be described. FIG. 1B represents the magnetic fields applied to Hall elements inside Hall ICs 102a and 102b and outputs of each Hall IC in the case where, provided that the state illustrated in FIG. 1A is an electrical angle of 0 degrees, the Hall ICs 102a and 102b are rotated therefrom about a magnet in the CCW direction. Also, FIG. 1C represents the magnetic fields applied to Hall elements inside Hall ICs 102a and 102b and outputs of each Hall IC in the case where, provided that the state illustrated in FIG. 1A is an electrical angle of 0 degrees, the Hall ICs 102a and 102b are rotated therefrom about a magnet in the CW direction. As the results demonstrate, it becomes possible to detect the rotational direction by taking the rising or the falling in the output of one of the Hall ICs as a trigger, and seeing whether the state of the output of the other Hall IC is high or low. In this example, the falling of the Hall IC 10b is set as the trigger.

However, this configuration entails the use of two separate Hall ICs, and thus it is necessary to change the placement of the Hall ICs to match the pitch of the multipolar magnet, and the effects of assembly misalignment or the like cannot be ignored. For this reason, as a technique for improving the above, there exists a technique that, as in FIGS. 1 and 2 in Patent Literature 1, enables direction detection with one chip by using magnetic convergence plates made up of a magnetic body, and utilizing a property that the phases of a vertical magnetic field and a horizontal magnetic output in conjunction with the rotation of a multipolar magnet such as in FIG. 8 of Patent Literature 1 are offset by an electrical angle of 90 degrees with respect to an electromagnetic transducer magneto-sensing surface. This method improves the problems discussed above, and is an effective technique as a magnetic encoder or input device.

CITATION LIST

Patent Literature

PTL 1: Japanese Patent Laid-Open No. 2009-150732

SUMMARY OF INVENTION

Technical Problem

However, in applications such as wheel speed sensors broadly used in recent years, demands are rising for the sensor to be operable even if the distance between the multipolar magnet and the sensor is increased, or in other words even if the magnetic field strength applied to the sensor is in a low state, rising for less jitter in the output even in environments in which the magnetic noise disturbance is inferior, and also rising for output that accurately corresponds to the pole pitch of the multipolar magnet (generally called the output duty demand). As the magnetic flux density applied to the sensor from the multipolar magnet lowers, the effects of magnetic noise disturbance increase, degrading the output jitter and output duty. The technique of Patent Literature 1 discussed above does not mention such magnetic field noise disturbance.

The present invention has been devised in light of such problems, and takes as an object to provide a magnetic field measuring device that is capable of eliminating the effects of magnetic noise disturbance, and furthermore is capable of duty output that is both low-jitter and accurate even if the magnetic field strength applied to the sensor device and produced by the object of detection is low, particularly in applications that detect the position, move, or rotation of an object of detection, such as a wheel speed sensor.

Solution to Problem

The present invention has been devised in order to achieve such an object, and the invention described in Claim 1 is a magnetic field measuring device that detects the strength of a magnetic field produced from a magnetic field-producing body, characterized by comprising: first to fourth magnetoelectric transducers; magnetic convergence plates made up of a magnetic body; and a calculation unit that calculates the strength of a magnetic field applied in a horizontal direction and/or a vertical direction with respect to a magneto-sensing surface of the magnetoelectric transducers; wherein the magnetic convergence plates are placed in the vicinity of the first to fourth magnetoelectric transducers so as to convert magnetic field vectors produced in a horizontal direction with respect to the magneto-sensing surface of the first magnetoelectric transducer and the magneto-sensing surface of the second magnetoelectric transducer into magnetic field vectors in a vertical direction with respect to the magneto-sensing surface of the first magnetoelectric transducer and the magneto-sensing surface of the second magnetoelectric transducer, and also in opposite directions at the respective magneto-sensing surfaces, and in addition, convert magnetic field vectors produced in a horizontal direction with respect to the magneto-sensing surface of the third magnetoelectric transducer and the magneto-sensing surface of the fourth magnetoelectric transducer into magnetic field vectors in a vertical direction with respect to the magneto-sensing surface of the third magnetoelectric transducer and the magneto-sensing surface of the fourth magnetoelectric transducer, and also in opposite directions at the respective magneto-sensing surfaces, and the calculation unit includes a first calculation block that adds or subtracts outputs from the first to fourth magnetoelectric transducers to output a calculation result.

Also, the invention described in Claim 2 is a magnetic field measuring device that detects the strength of a magnetic field produced from a magnetic field-producing body, characterized by comprising: first to fourth magnetoelectric transducers; and a calculation unit that calculates the strength of a magnetic field applied in a horizontal direction and/or a vertical direction with respect to a magneto-sensing surface of the magnetoelectric transducers; wherein the calculation unit includes a first calculation block that adds or subtracts outputs from the first to fourth magnetoelectric transducers to output a calculation result, and a second calculation block that adds or subtracts outputs from the first to fourth magnetoelectric transducers to calculate a signal whose phase differs by 90 degrees from an output signal of the first calculation block to output a calculation result.

Also, the invention described in Claim 3 is characterized in that, in the invention described in Claim 1 or 2, the first calculation block includes a first addition/subtraction block that adds or subtracts outputs from the first magnetoelectric transducer and the second magnetoelectric transducer to output a calculation result, a second addition/subtraction block that adds or subtracts outputs from the third magnetoelectric transducer and the fourth magnetoelectric transducer to output a calculation result, and a third addition/subtraction block that adds or subtracts output from the first addition/subtraction block and output from the second addition/subtraction block to output a calculation result.

Also, the invention described in Claim 4 is characterized in that, in the invention described in Claim 1 or 2, the first calculation block includes a first addition/subtraction block that adds or subtracts outputs from the first magnetoelectric transducer and the third magnetoelectric transducer to output a calculation result, a second addition/subtraction block that adds or subtracts outputs from the second magnetoelectric transducer and the fourth magnetoelectric transducer to output a calculation result, and a third addition/subtraction block that adds or subtracts output from the first addition/subtraction block and output from the second addition/subtraction block to output a calculation result.

Also, the invention described in Claim 5 is characterized in that, in the invention described in any of Claims 1 to 4, the calculation unit includes a second calculation block that adds or subtracts outputs from the first to fourth magnetoelectric transducers to calculate a signal whose phase differs from an output signal of the first calculation block.

Also, the invention described in Claim 6 is characterized in that, in the invention described in Claim 5, the phase difference between an output signal from the first calculation block and an output signal from the second calculation block is 90 degrees.

Also, the invention described in Claim 7 is characterized in that, in the invention described in Claim 5 or 6, the second calculation block includes a fourth addition/subtraction block that adds or subtracts outputs from the first magnetoelectric transducer and the second magnetoelectric transducer to output a calculation result, a fifth addition/subtraction block that adds or subtracts outputs from the third magnetoelectric transducer and the fourth magnetoelectric transducer to output a calculation result, and a sixth addition/subtraction block that adds or subtracts output from the fourth addition/subtraction block and output from the fifth addition/subtraction block to output a calculation result.

Also, the invention described in Claim 8 is characterized in that, in the invention described in Claim 5 or 6, the second calculation block includes a fourth addition/subtraction block that adds or subtracts outputs from the first magnetoelectric transducer and the third magnetoelectric transducer to output a calculation result, a fifth addition/subtraction block that adds or subtracts outputs from the second magnetoelectric transducer and the fourth magnetoelectric transducer to output a calculation result, and a sixth addition/subtraction block that adds or subtracts output from the fourth addition/subtraction block and output from the fifth addition/subtraction block to output a calculation result.

Also, the invention described in Claim 9 is characterized in that, in the invention described in any of Claims 1 to 8, the first to fourth magnetoelectric transducers are placed approximately linearly.

Also, the invention described in Claim 10 is characterized in that, in the invention described in any of Claims 1 to 9, the calculation unit detects position, move, or rotation of the magnetic field-producing body.

Also, the invention described in Claim 11 is characterized in that, in the invention described in Claim 10, the calculation unit detects position, move, or rotation of the magnetic field-producing body, on the basis of output from the first calculation block.

Also, the invention described in Claim 12 is characterized in that, in the invention described in Claim 10 or 11, the calculation unit detects position, move, or rotation of the magnetic field-producing body, on the basis of a signal obtained by forming an output signal from the first calculation block into a pulse waveform.

Also, the invention described in Claim 13 is characterized in that, in the invention described in any of Claims 5 to 8, the calculation unit detects position, move, or rotation of the magnetic field-producing body, on the basis of output from the first calculation block, and output from the second calculation block.

Also, the invention described in Claim 14 is characterized in that the invention described in any of Claims 1 to 13 comprises a magnetic field-producing body, wherein the magnetic field-producing body is a movable and/or rotatable multipolar-magnetized magnet, or alternatively, a structure composed of a back-bias magnet installed in the vicinity of the first to fourth magnetoelectric transducers, and movable and/or rotatable gear teeth.

Also, the invention described in Claim 15 is characterized in that the invention described in any of Claims 1 to 13 comprises a magnetic field-producing body, wherein the magnetic field-producing body is a structure composed of a back-bias magnet installed in the vicinity of the first to fourth magnetoelectric transducers, and movable and/or rotatable gear teeth, and the first to fourth magnetoelectric transducers are installed at positions between the back-bias magnet and the gear teeth.

Advantageous Effects of Invention

According to the present invention, it becomes possible to provide a magnetic field measuring device which is adaptable to applications that detect the position, move, or rotation of an object of detection, and additionally, is capable of eliminating the effects of magnetic noise disturbance in the case of detecting the position, move, or rotation of an object of detection, and furthermore is capable of duty output that is both low-jitter and accurate even if the magnetic field strength applied to the sensor device and produced by the object of detection is low.

BRIEF DESCRIPTION OF DRAWINGS

FIG. 10A is a diagram for explaining signal processing in Embodiment 1;

FIG. 10B is a diagram for explaining signal processing in Embodiment 1;

FIG. 11A is a diagram illustrating an output waveform from the output shaping unit illustrated in FIG. 6;

FIG. 11B is a diagram illustrating an output waveform from the output shaping unit illustrated in FIG. 6;

DESCRIPTION OF EMBODIMENTS

Hereinafter, specific examples of a magnetic field measuring device according to the present invention will be described with reference to the drawings. Embodiment 1 primarily describes the case of applying a magnetic field measuring device of the present invention to rotation detection of an object of detection. Embodiment 2 primarily describes the case of applying a magnetic field measuring device of the present invention to position detection of an object of detection. Embodiment 3 primarily describes the case of applying a magnetic field measuring device of the present invention to gear tooth detection.

Embodiment 1

Embodiment 1 relates to a magnetic field measuring device in the case where the object of rotation detection is a multipolar ring magnet, and Hall elements are used as magnetoelectric transducers.

Figure 1:
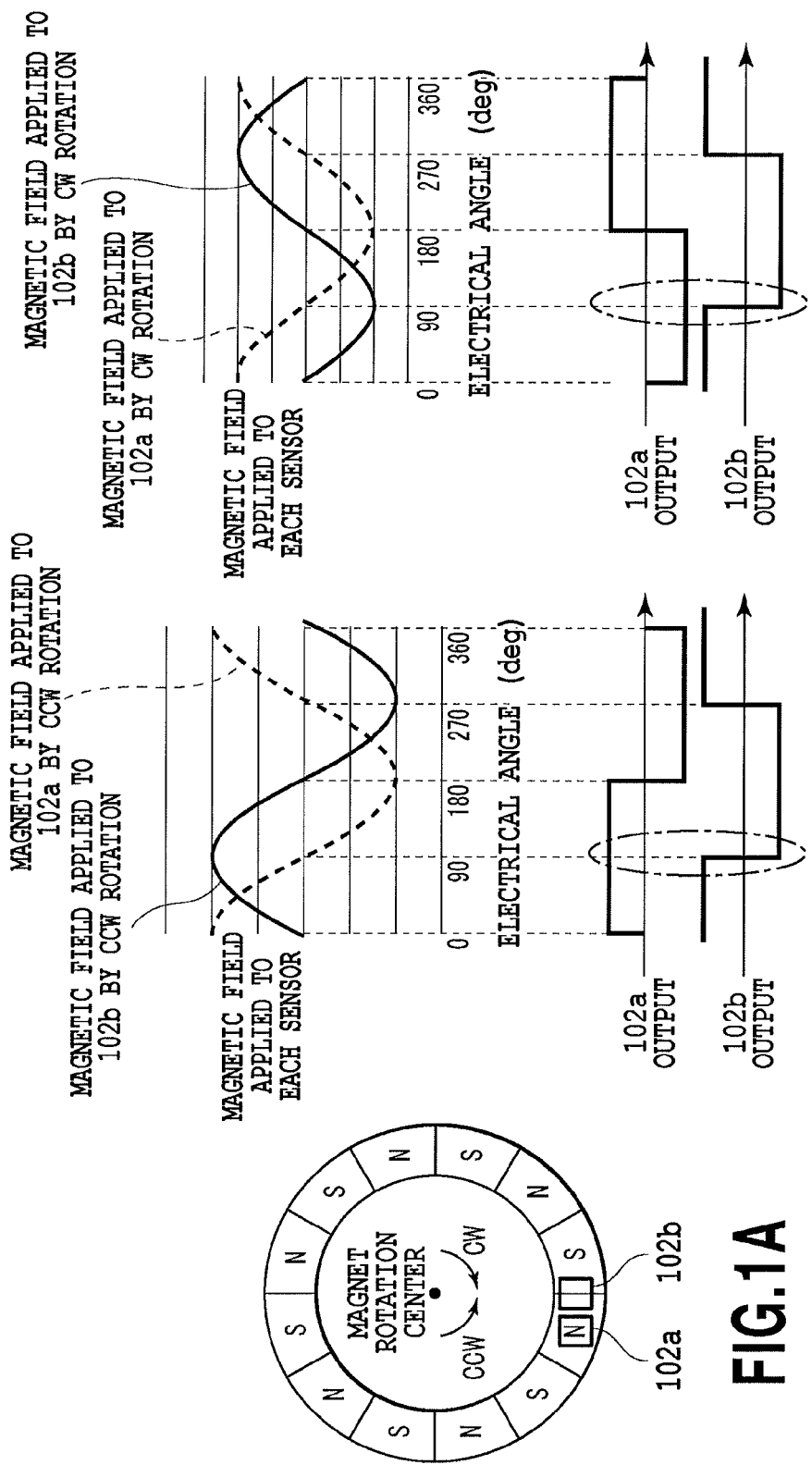
FIG. 1A is a diagram for explaining a magnetic encoder of the related art.
FIG. 1B is a diagram for explaining a magnetic encoder of the related art.
FIG. 1C is a diagram for explaining a magnetic encoder of the related art.
Figure 2:
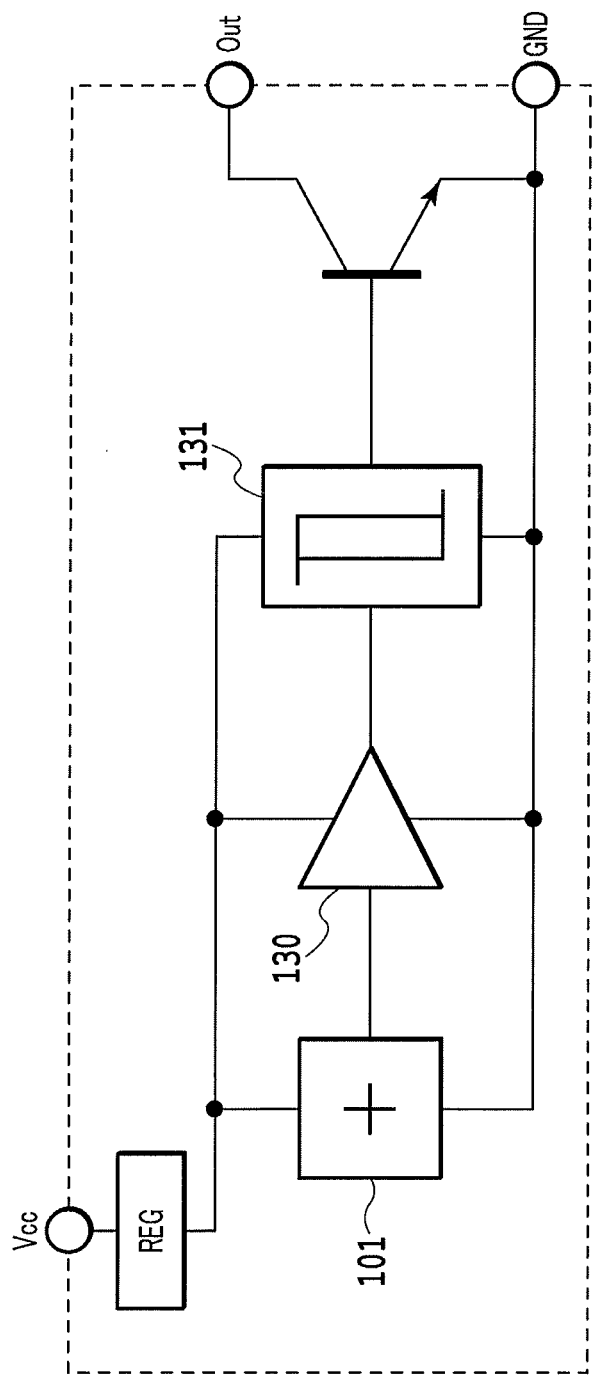
FIG. 2 is a block diagram of a Hall IC in general use in the related art.
Figure 3:
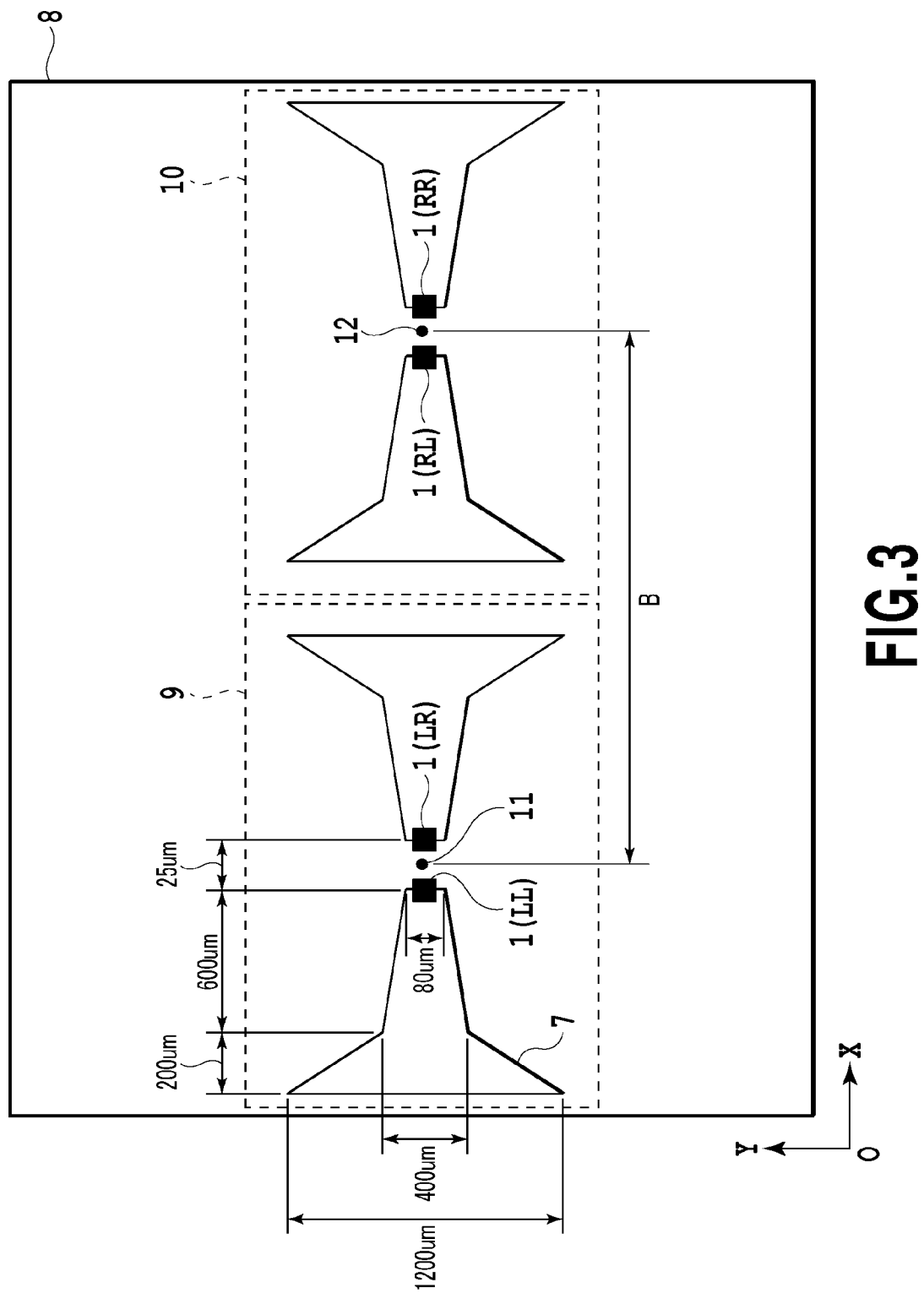
FIG. 3 is a configuration diagram for explaining respective embodiments given as a magnetic field measuring device according to the present invention.
Figure 6:
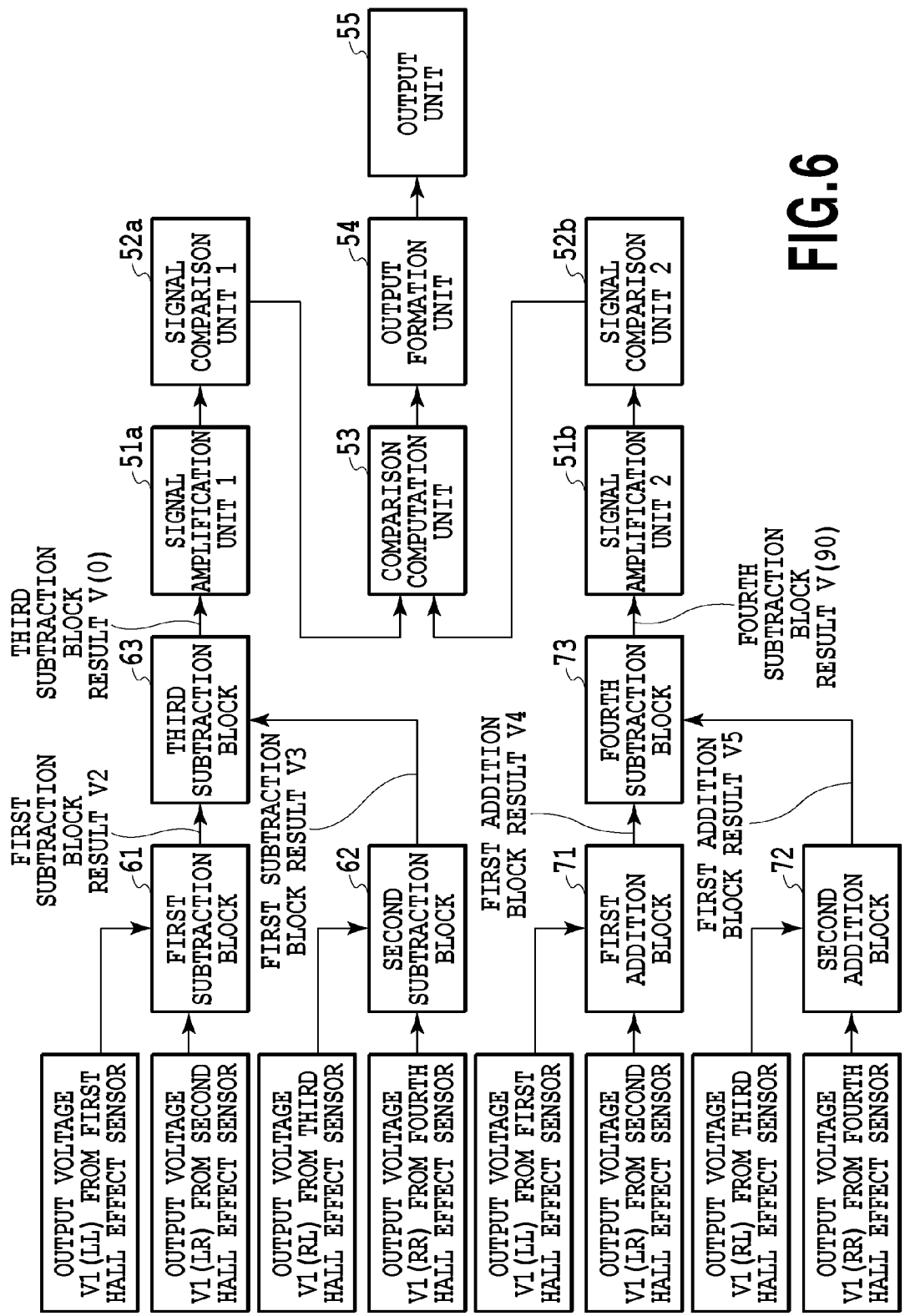
FIG. 6 is a diagram illustrating internal signals of a detection field in a magnetic field measuring device according to the present invention.
Figure 7:
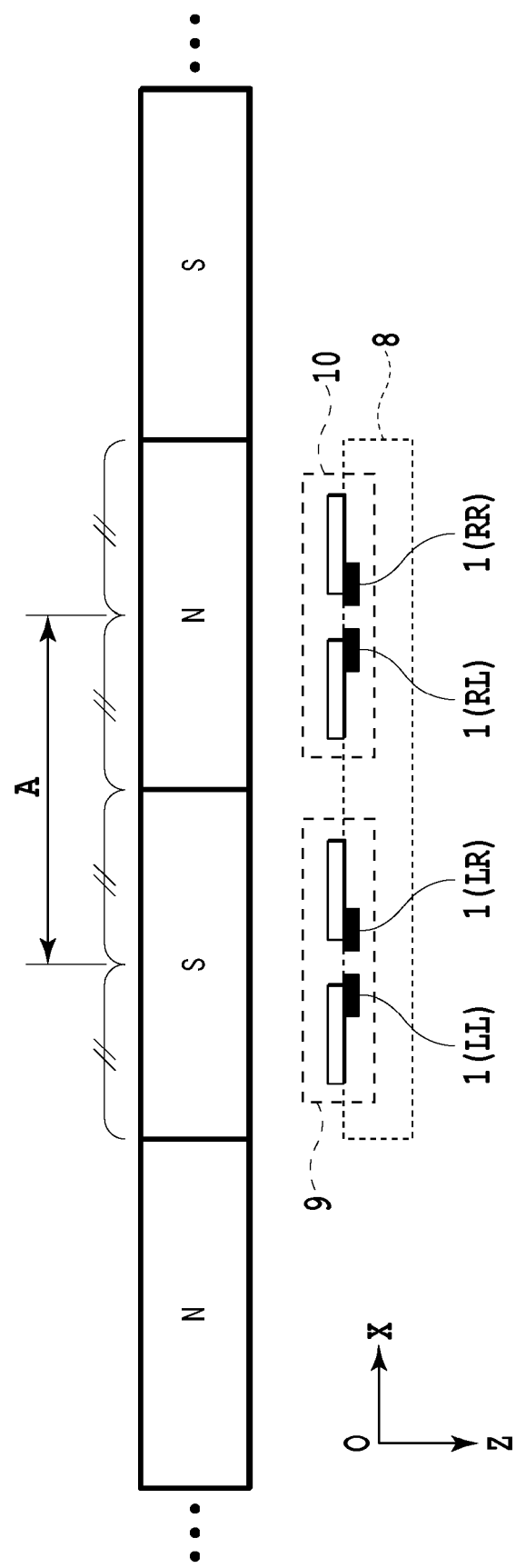
FIG. 7 is a diagram illustrating the placement relationship between an object of detection and Hall elements.
Figure 8:
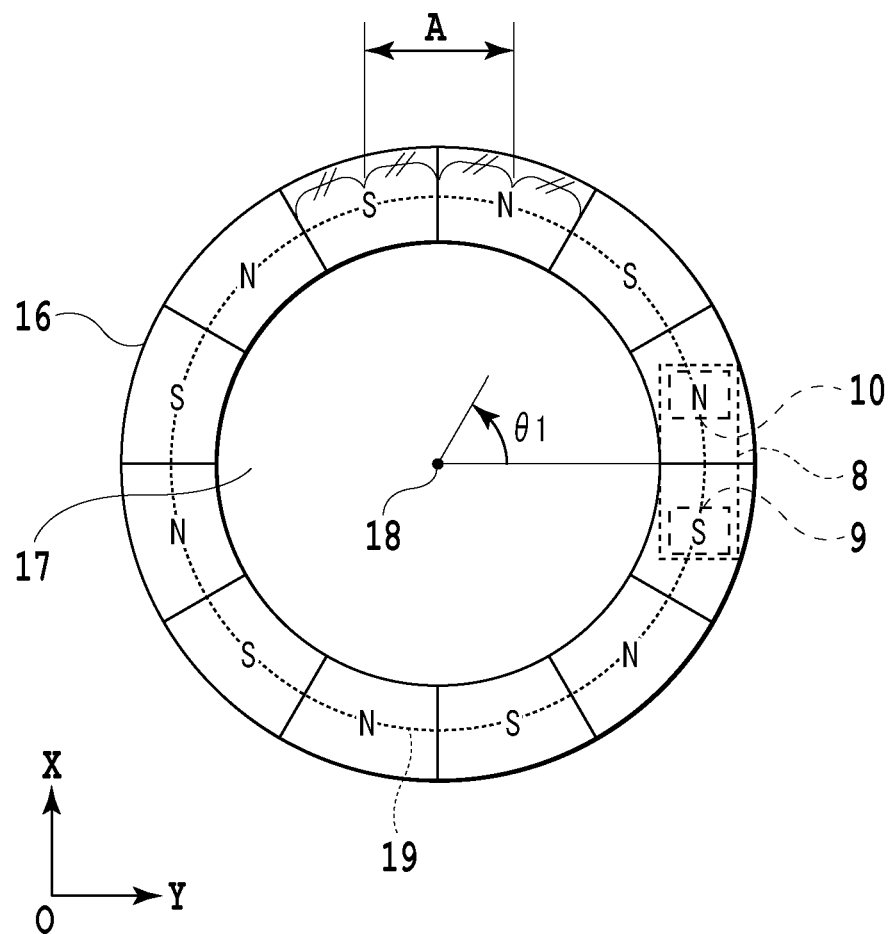
FIG. 8 is a top view for explaining a magnetic field measuring device in Embodiment 1.
Figure 18:
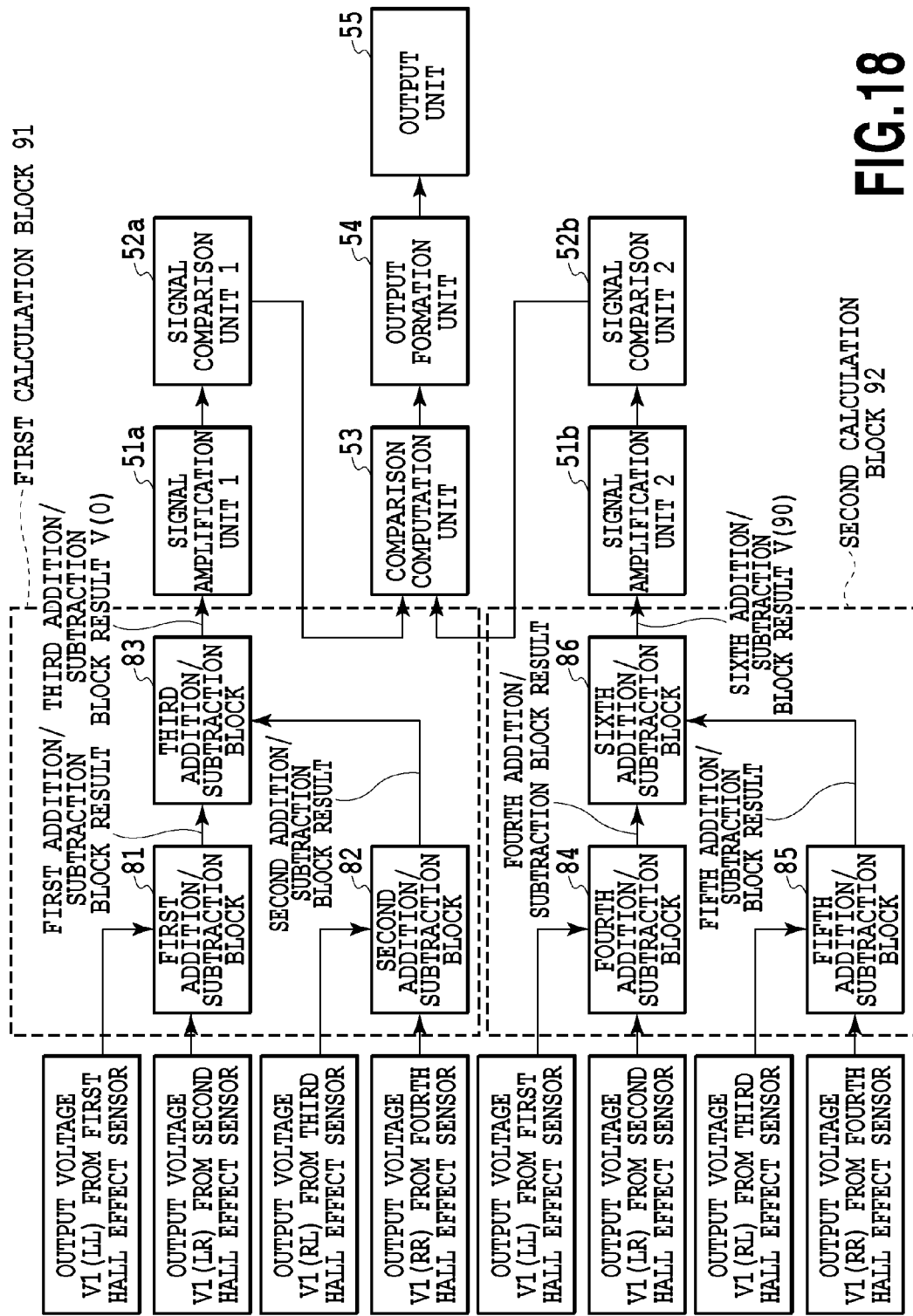
FIG. 18 is a diagram illustrating internal signals of a detection field in a magnetic field measuring device according to the present invention.

FIG. 3 illustrates a sensor configuration for explaining a magnetic field measuring device in Embodiment 1. FIG. 8 is a top view for explaining a magnetic field measuring device. FIG. 7 is a side view. FIGS. 6 and 18 are block diagrams for explaining signal processing.

FIG. 3 is a configuration diagram for explaining respective embodiments given as a magnetic field measuring device according to the present invention. A sensor unit in Embodiment 1 is configured such that Hall elements are produced on a silicon substrate, and magnetic convergence plates made up of a magnetic thin material are produced nearby. The sensor unit in Embodiment 1 is roughly divided such that sensor units exist in two places (distinguished as the sensor units 9 and 10). The sensor units referred to herein are configured from Hall elements and magnetic convergence plates made up of a magnetic body. In each sensor unit, it is possible to detect a horizontal magnetic field and a vertical magnetic field respectively and independently applied to a sensor surface.

Also, a detailed sensor configuration is as follows.

1(LL) is a first Hall element in the left sensor unit 9, 1(LR) is a second Hall element in the left sensor unit 9, 1(RL) is a third Hall element in the right sensor unit 10, 1(RR) is a fourth Hall element in the right sensor unit 10, 7 is a magnetic convergence plate configured from a magnetic body, 8 is a silicon substrate, 11 is a magnetic magneto-sensing unit center in the left sensor unit, 12 is a magnetic magneto-sensing unit center in the right sensor unit, and the sign B represents the distance between the left and right magnetic magneto-sensing unit centers (2 mm in the present embodiment). The first Hall element to the fourth Hall element are placed such that the normal directions of the magneto-sensing surfaces of the Hall elements (the directions of the magneto-sensing surfaces) are approximately equal.

The magnetic magneto-sensing unit centers referred to herein represent the centers of symmetry in each sensor unit. Also, the Hall elements are preferably installed on the lower ends of the magnetic convergence plates. However, the configuration is not necessarily limited thereto, insofar as the installation yields the necessary sensitivity to conduct effective rotation detection. Also, the magnetic convergence plates and the Hall elements preferably exist in a mirror-image relationship with respect to a mirror surface parallel to the YZ plane and passing through the magnetic magneto-sensing unit center of each sensor unit. However, the configuration is not necessarily limited thereto, insofar as the configuration is within a range in which there are effectively no large effects on the disturbance offset elimination and duty performance discussed later.

Also, in the present example, the magnet pitch A is matched to the distance B between the magnetic magneto-sensing unit centers. This is in order to make different magnetic fields with 180 degree phase be input at the respective magnetic magneto-sensing unit centers. Note that the sensor units are defined to be on the XY plane.

Figure 4:
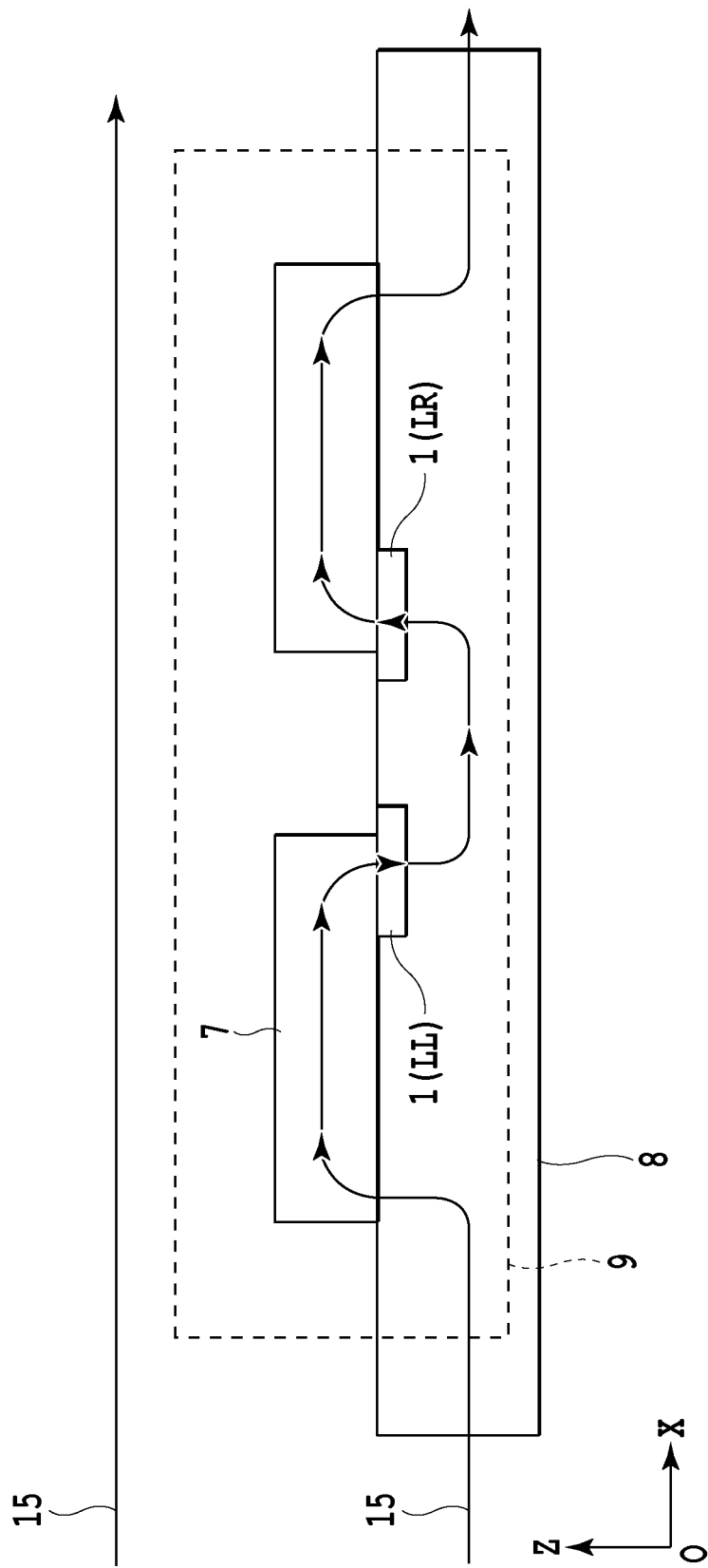
FIG. 4 is a side view of the magnetic convergence plate sensor unit 9 illustrated in FIG. 3.

FIG. 4 is a diagram for explaining the role of the magnetic convergence plates illustrated in FIG. 3. The effects of the magnetic convergence plates will now be described using FIG. 4.

FIG. 4 illustrates the state of a magnetic path in the case where magnetic convergence plates are installed in a uniform horizontal magnetic field. The magnetic convergence plates have the property of converting a horizontal magnetic field into a vertical magnetic field. As illustrated in FIG. 4, the horizontal magnetic field is directionally converted into a vertical magnetic field in the Hall element units. The magnetic convergence plates are installed near the first to the fourth Hall elements, such that magnetic field vectors produced in a horizontal direction with respect to the magneto-sensing surface of the first Hall element and the magneto-sensing surface of the second Hall element are converted into magnetic field vectors in a vertical direction with respect to the magneto-sensing surface of the first Hall element and the magneto-sensing surface of the second Hall element, and also in opposite directions at the respective magneto-sensing surfaces, and such that magnetic field vectors produced in a horizontal direction with respect to the magneto-sensing surface of the third Hall element and the magneto-sensing surface of the fourth Hall element are converted into magnetic field vectors in a vertical direction with respect to the magneto-sensing surface of the third Hall element and the magneto-sensing surface of the fourth Hall element, and also in opposite directions at the respective magneto-sensing surfaces. In this case, if shapes and dimensions like those of the magnetic convergence plates 7 illustrated in FIGS. 3 and 4 are used, the horizontal magnetic field strength applied to each sensor unit is converted into a vertical magnetic field multiplied by some coefficient. When the size of the Hall element magneto-sensing surfaces are 30 μm×30 μm, this coefficient becomes a factor of approximately 7.3. This coefficient is called the magnetic amplification rate. This coefficient depends on the magnetic convergence plate shape and dimensions. Also, a magnetic field in the vertical z direction is also amplified somewhat and input into the lower ends of the magnetic convergence plates, becoming approximately 1.2 times.

Herein, the main reason for installing mirror-symmetric magnetic convergence plates as in FIG. 4 is because, while a magnetic circuit able to significantly improve the magnetic amplification rate is also formed, as indicated in detail later, by computing the output signal of each Hall element, a z direction magnetic field and an x direction magnetic field are separated and detected, and the effects of magnetic field disturbance discussed later are eliminated. In the case of asymmetric magnetic convergence plates, the above magnetic amplification rate differs according to the shape and size of each magnetic convergence plate, and thus the advantage of eliminating the effects of magnetic field disturbance is degraded, and the separation by computation into a Z direction and an X direction may not longer be accurately conducted. The magnetic field strength applied to each Hall element is directionally converted such that, as FIG. 4 demonstrates, in a spatially uniform horizontal magnetic field, a magnetic field is applied to 1(LL) in the negative z direction, and to 1(LR) in the positive z direction. In other words, the phase difference becomes 180 degrees in the case of applying a sinusoidal magnetic field. Also, in the case where a magnetic field is applied in a spatially uniform vertical direction (on the positive z direction side), a magnetic field is input into 1(LL) and 1(LR) in the positive z direction. In other words, the phase difference becomes 0 degrees in the case where a sinusoidal magnetic field is applied in the vertical direction.

Figure 5:
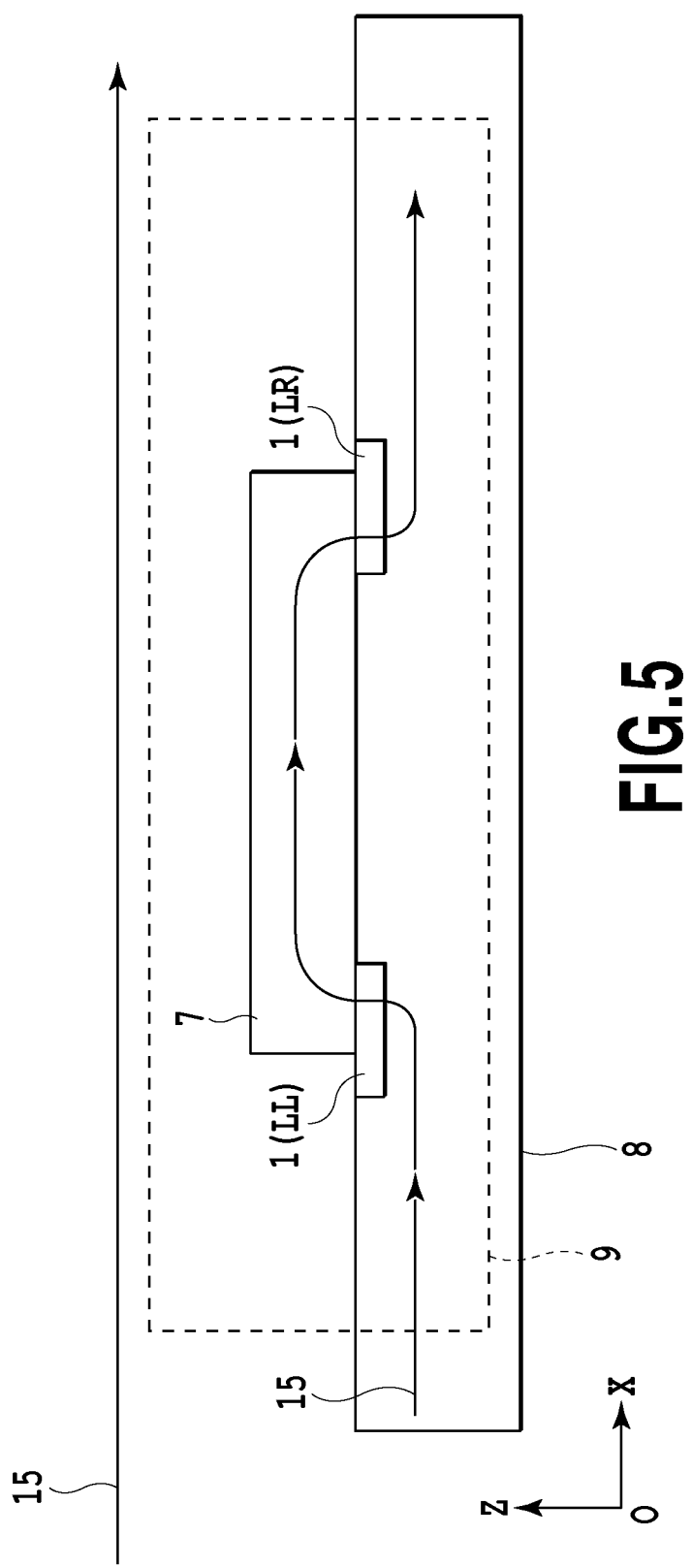
FIG. 5 is a diagram for explaining the role of the magnetic convergence plates illustrated in FIG. 3.
Figure 17A:
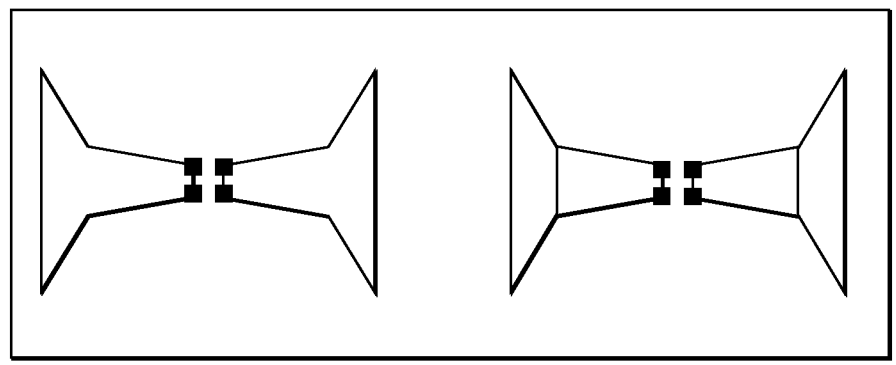
FIG. 17A is a diagram illustrating an example of a usable magnetic field convergence plate shape in Examples 1, 2, and 3.
Figure 17B:
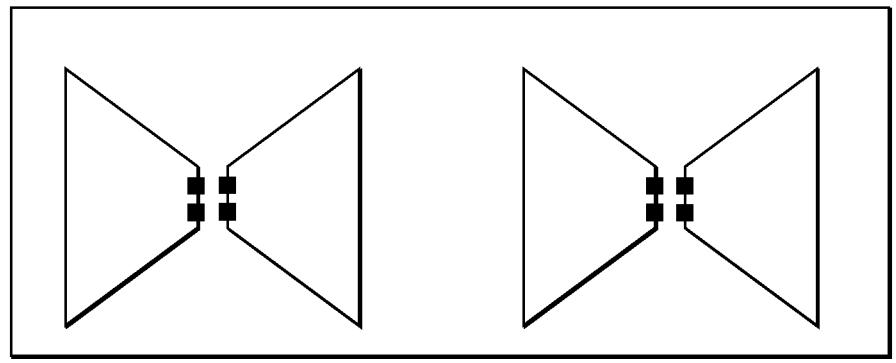
FIG. 17B is a diagram illustrating an example of a usable magnetic field convergence plate shape in Examples 1, 2, and 3.
Figure 17C:
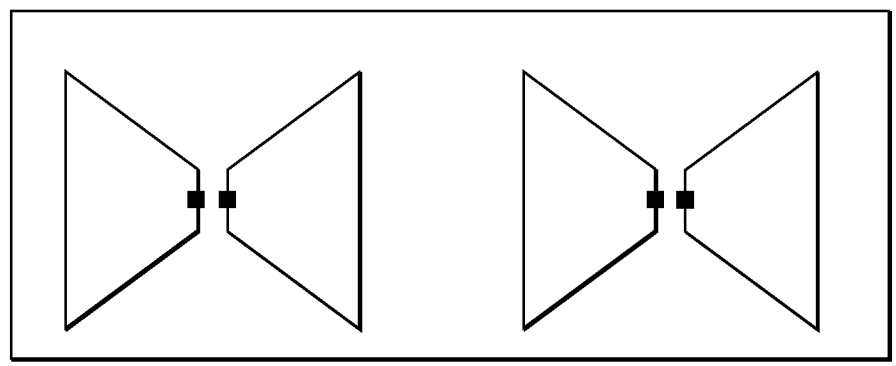
FIG. 17C is a diagram illustrating an example of a usable magnetic field convergence plate shape in Examples 1, 2, and 3.

By utilizing this principle, it is possible to detect by subtracting the signal of the Hall element 1(LL) and 1(L and R in 1(LR)) in the case of wanting to detect a horizontal magnetic field (x direction), and adding the signal of the Hall element 1(LL) in the case of detecting a vertical magnetic field (z direction). Thus, in the present example shape, magnetic fields are detectable along the two axes of the x and z directions. Also, in the present example, although the shape used in FIG. 3 is used, being able to use magnetic convergence plate shapes like those in FIG. 5, FIG. 16, and FIG. 17 is similar to the principle discussed above. Also, this principle is likewise similar for the Hall elements 1(RL) and 1(RR), and magnetic fields are detectable along the two axes of the x and z directions.

FIG. 7 is a side view illustrating the placement relationship between an object of detection and Hall elements, while FIG. 8 is a top view for explaining a magnetic field measuring device in Embodiment 1.

The sign A in FIGS. 7 and 8 represents the pitch distance (2 mm in the present example) between an N pole and an S pole of a multipolar magnet. 16 is a 12-pole ring magnet, which is the object of rotation (object of detection), while 17 is the rotary shaft of the object of rotation, and θ1 is the rotational angle. Note that the rotational axis is parallel to the Z axis, and defined to rotate about a rotary shaft rotational axis 18. Also, the drawing currently expressed is defined to have a rotational angle of 0 degrees, and represents a state of rotating in the counter-clockwise direction of the drawing. The multipolar magnet 16 moves and rotates in the magnetized direction.

Also, the respective magnetic magneto-sensing unit centers 11 and 12 are near the XY coordinates on the circle 19 constituted by the midpoint of the inner diameter and the outer diameter of the multipolar ring magnet 16, distanced from the ring magnet by a given distance. In this case, the sensor substrate is approximately parallel to the ring magnet surface.

Also, the first to fourth Hall elements are placed approximately linearly along the magnetized direction of the multipolar ring magnet.

FIG. 6 is a diagram illustrating internal signals of detected magnetic fields in a magnetic field measuring device, and is a diagram representing the signal flow of each Hall element.

In FIG. 6, V1(LL) is the output voltage from the Hall element 1(LL), V1(LR) is the output voltage from the Hall element 1(LR), V1(RL) is the output voltage from the Hall element 1(RL), V1(RR) is the output voltage from the Hall element 1(RR), and additionally, V2 is the result of taking the difference between V1(LR) and V1(LL), V3 is the result of taking the difference between V1(RL) and V1(RR), V4 is the result of taking the sum of V1(LL) and V1(LR), V5 is the result of taking the sum of V1(RL) and V1(RR). Then, V(0) is the result of taking the difference between V2 and V3, and V(90) is the result of taking the difference between V4 and V5.

These signals are input into a signal amplification unit that conducts amplification, a signal comparison unit that conducts signal comparison, a comparison computation unit that analyzes a comparison state, an output formation unit that creates an output state, and an output unit that conducts final output. Specific details will be discussed later.

In FIGS. 7 and 8, a magnetic field that a 12-pole magnet imparts to the magnetic magneto-sensing unit center 11 in the sensor unit 9 and the magnetic magneto-sensing unit center 12 in the sensor unit 10 may be approximated as sine waves/cosine waves according to the following formulas, in conjunction with the counter-clockwise rotation of the multipolar ring magnet.

[Math. 1]

$$B_\perp(9) = B'0 \times \cos\theta + Bz\text{offset}(t) \quad (1)$$

$$B_\perp(10) = B'0 \times \cos\theta + Bz\text{offset}(t) \quad (2)$$

$$B_{//}(9) = B0 \times \sin\theta + Bx\text{offset}(t) \quad (3)$$

$$B_{//}(10) = -B0 \times \sin\theta + Bx\text{offset}(t) \quad (4)$$

Herein, Eq. 1 expresses the magnetic flux density in the vertical z direction at the sensor surface input into the magnetic magneto-sensing unit center 11 illustrated in FIG. 3, Eq. 2 expresses the magnetic flux density in the vertical z direction at the sensor surface input into the magnetic magneto-sensing unit center 12, Eq. 3 expresses the magnetic flux density in the horizontal x direction at the sensor surface input into the magnetic magneto-sensing unit center 11, Eq. 4 expresses the magnetic flux density in the x direction at the sensor surface input into the magnetic magneto-sensing unit center 12, B'0 expresses the magnetic flux density amplitude in the vertical z direction output by the ring magnet 16, B0 expresses the magnetic flux density amplitude in the horizontal x direction output by the ring magnet 16, Bzoffset(t) expresses the magnetic field disturbance (magnetic noise) in the z direction at a given time, and Bxoffset(t) expresses the magnetic field disturbance (magnetic noise) in the x direction at a given time. Herein, the magnetic field disturbance (magnetic noise) in the y direction is ignored, but this is because the sensor is unable to detect a magnetic field in the y direction. Also, θ referred to herein is the electrical angle, and in the case of an even-numbered multipolar magnet as herein, θ is the product θ=θ1×N/2 of the rotational angle (mechanical angle) θ1 times half the number of poles N.

The sensor units 9 and 10, to which is applied a magnetic field as in Eq. 1 above, convert the horizontal magnetic flux density at the sensor face into a vertical magnetic field times K (taken to be the horizontal magnetic field to vertical magnetic field conversion rate) at the Hall element magneto-sensing surfaces due to the effect of the magnetic convergence plates. Also, a vertical magnetic flux density at the sensor surface is multiplied by K' (taken to be the vertical magnetic field amplification rate) and becomes a vertical magnetic field at the Hall element magneto-sensing surfaces.

Thus, the vertical magnetic fields at the magneto-sensing surfaces applied to the Hall elements 1(LL), 1(LR), 1(RL), and 1(RR) become like the following respective formulas.

[Math. 2]

$$B[1(LL)] = \\ +K\left(B0\sin\left(\theta - \frac{\alpha}{2}\right) + By\text{offset}(t)\right) + K'(-B'0\cos\theta + Bz\text{offset}(t)) \quad (5)$$

$$B[1(LR)] = \\ -K\left(B0\sin\left(\theta + \frac{\alpha}{2}\right) + By\text{offset}(t)\right) + K'(-B'0\cos\theta + Bz\text{offset}(t)) \quad (6)$$

$$B[1(RL)] = K\left(-B0\sin\left(\theta - \frac{\alpha}{2}\right) + By\text{offset}(t)\right) + K'(B'0\cos\theta + Bz\text{offset}(t)) \quad (7)$$

$$B[1(RR)] = \\ -K\left(-B0\sin\left(\theta + \frac{\alpha}{2}\right) + By\text{offset}(t)\right) + K'(B'0\cos\theta + Bz\text{offset}(t)) \quad (8)$$

Herein, Eq. 5 is the vertical magnetic flux density at the Hall element magneto-sensing surface input into 1(LL), Eq. 6 is the vertical magnetic flux density at the Hall element input into 1(LR), Eq. 7 is the vertical magnetic flux density at the Hall element input into 1(RL), and Eq. 8 is the vertical magnetic flux density at the Hall element input into 1(RR).

Herein, α represents the offset from 180 degrees of the phase difference between the left and right Hall elements in the sensor units 9 and 10, which produces a large value only for a horizontal magnetic field at the sensor surface. This offset α from a phase difference of 180 degrees is produced because the magnetic field produced from the multipolar magnet in the x direction (horizontal direction) with respect to each sensor unit is non-uniform and not completely horizontal. At this point, a slight phase offset is actually also produced in the vertical magnetic field, but is extremely small, and thus ignored in this description. Also, α is a constant determined by the size of the multipolar magnet, the size of the magnetic convergence plates, the size of the magnet, and their placement.

For this reason, provided that C is the magnetic flux density voltage conversion rate (V/T), which is the output voltage per unit magnetic flux density of a Hall element, the output voltages V1(LL), V1(LR), V1(RL), and V1(RR) of the Hall elements 1(LL), 1(LR), 1(RL), and 1(RR) become like the following formulas.

[Math. 3]

$$V1(LL) = \\ C \times \left(K\left(B0\sin\left(\theta - \frac{\alpha}{2}\right) + Bx\text{offset}(t)\right) + K'(-B'0\cos\theta + Bz\text{offset}(t))\right) \quad (9)$$

$$V1(LR) = \\ C \times \left(-K\left(B0\sin\left(\theta + \frac{\alpha}{2}\right) + Bx\text{offset}(t)\right) + K'(-B'0\cos\theta + Bz\text{offset}(t))\right) \quad (10)$$

$$V1(RL) = \quad (11)$$
$$C \times \left( K \left( -B0\sin\left(\theta - \frac{\alpha}{2}\right) + Bxoffset(t) \right) + K'(B'0\cos\theta + Bzoffset(t)) \right)$$

$$V1(RR) = \quad (12)$$
$$C \times \left( -K \left( -B0\sin\left(\theta + \frac{\alpha}{2}\right) + Bxoffset(t) \right) + K'(B'0\cos\theta + Bzoffset(t)) \right)$$

Next, by conducting computation of the sums and differences of the voltages obtained at this point in the signal processing in FIG. 6, computing V2, V3, V4, and V5 yields the following formula.

[Math. 4]

$$V2 = V1(LL) - V1(LR) \quad (13)$$
$$= C \times \left( K \left( B0\sin\left(\theta - \frac{\alpha}{2}\right) + Bxoffset(t) \right) + K'(-B'0\cos\theta + Bzoffset(t)) \right) -$$
$$C \times \left( -K \left( B0\sin\left(\theta + \frac{\alpha}{2}\right) + Bxoffset(t) \right) + K'(-B'0\cos\theta + Bzoffset(t)) \right)$$
$$= C \times K \times \left( B0 \left( \sin\left(\theta + \frac{\alpha}{2}\right) + \sin\left(\theta - \frac{\alpha}{2}\right) \right) + 2Bxoffset(t) \right)$$
$$= 2CK \left( B0\sin\theta\cos\left(\frac{\alpha}{2}\right) + Bxoffset(t) \right)$$

$$V3 = V1(RL) - V1(RR) \quad (14)$$
$$= C \times \left( K \left( -B0\sin\left(\theta - \frac{\alpha}{2}\right) + Bxoffset(t) \right) + K'(B'0\cos\theta + Bzoffset(t)) \right) -$$
$$C \times \left( -K \left( -B0\sin\left(\theta + \frac{\alpha}{2}\right) + Bxoffset(t) \right) + K'(B'0\cos\theta + Bzoffset(t)) \right)$$
$$= -C \times K \times \left( B0 \left( \sin\left(\theta + \frac{\alpha}{2}\right) + \sin\left(\theta - \frac{\alpha}{2}\right) \right) - 2Bxoffset(t) \right)$$
$$= -2CK \left( B0\sin\theta\cos\left(\frac{\alpha}{2}\right) - Bxoffset(t) \right)$$

$$V4 = V1(LL) + V1(LR) \quad (15)$$
$$= C \times \left( K \left( B0\sin\left(\theta - \frac{\alpha}{2}\right) + Bxoffset(t) \right) + K'(-B'0\cos\theta + Bzoffset(t)) \right) +$$
$$C \times \left( -K \left( B0\sin\left(\theta + \frac{\alpha}{2}\right) + Bxoffset(t) \right) + K'(-B'0\cos\theta + Bzoffset(t)) \right)$$
$$= C \times \left( K \times B0 \left( -\sin\left(\theta + \frac{\alpha}{2}\right) + \sin\left(\theta - \frac{\alpha}{2}\right) \right) + 2K'(-B'0\cos\theta + Bzoffset(t)) \right)$$
$$= 2C \times \left( -K \times B0\cos\theta \times \sin\left(\frac{\alpha}{2}\right) + K'(-B'0\cos\theta + Bzoffset(t)) \right)$$
$$= -2\left( CKB0\sin\left(\frac{\alpha}{2}\right) + K'CB'0 \right)\cos\theta + 2CK'Bzoffset(t)$$

$$V5 = V1(RL) + V1(RR) \quad (16)$$
$$= C \times \left( K \left( -B0\sin\left(\theta - \frac{\alpha}{2}\right) + Bxoffset(t) \right) + K'(B'0\cos\theta + Bzoffset(t)) \right) +$$
$$C \times \left( -K \left( -B0\sin\left(\theta + \frac{\alpha}{2}\right) + Bxoffset(t) \right) + K'(B'0\cos\theta + Bzoffset(t)) \right)$$
$$= C \times \left( K \times \left( -B0\sin\left(\theta - \frac{\alpha}{2}\right) + B0\sin\left(\theta + \frac{\alpha}{2}\right) \right) + 2K'(B'0\cos\theta + Bzoffset(t)) \right)$$
$$= 2CKB0\cos\theta\sin\left(\frac{\alpha}{2}\right) + 2K'CB'0\cos\theta + 2K'CBzoffset(t)$$
$$= 2\left( CKB0\sin\left(\frac{\alpha}{2}\right) + K'CB'0 \right)\cos\theta + 2K'CBzoffset(t)$$

Consequently, V(0) and V(90) as in FIG. 6 are obtained as follows.

[Math. 5]

$$V(0) = V2 - V3 \quad (17)$$
$$= 2CK \left( B0\sin\theta\cos\left(\frac{\alpha}{2}\right) + Bxoffset(t) \right) -$$
$$\left[ -2CK \left( B0\sin\theta\cos\left(\frac{\alpha}{2}\right) - Bxoffset(t) \right) \right]$$
$$= 4CKB0\sin\theta\cos\left(\frac{\alpha}{2}\right)$$

$$V(90) = -V4 + V5 \quad (18)$$
$$= 2\left( CKB0\sin\left(\frac{\alpha}{2}\right) + K'CB'0 \right)\cos\theta + 2K'CBzoffset(t) -$$
$$\left[ -2\left( CKB0\sin\left(\frac{\alpha}{2}\right) + K'CB'0 \right)\cos\theta + 2CK'Bzoffset(t) \right]$$
$$= 4C\left( KB0\sin\left(\frac{\alpha}{2}\right) + K'B'0 \right)\cos\theta$$

Herein, FIG. 9 illustrates the major results of magnetic flux density and electrical signal computation in the case of rotation through one period of the electrical angle discussed above (corresponding to the 12-pole ring magnet 16 rotating through a mechanical angle of 30 degrees).

Figure 9A:
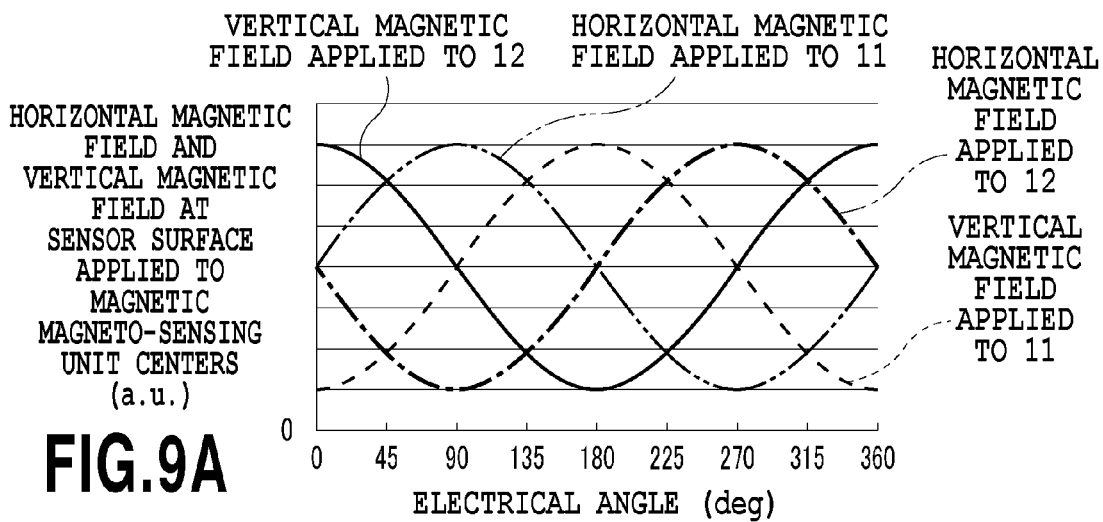
FIG. 9A is a diagram illustrating the results of signal calculation for one electrical angle period.
Figure 9B:
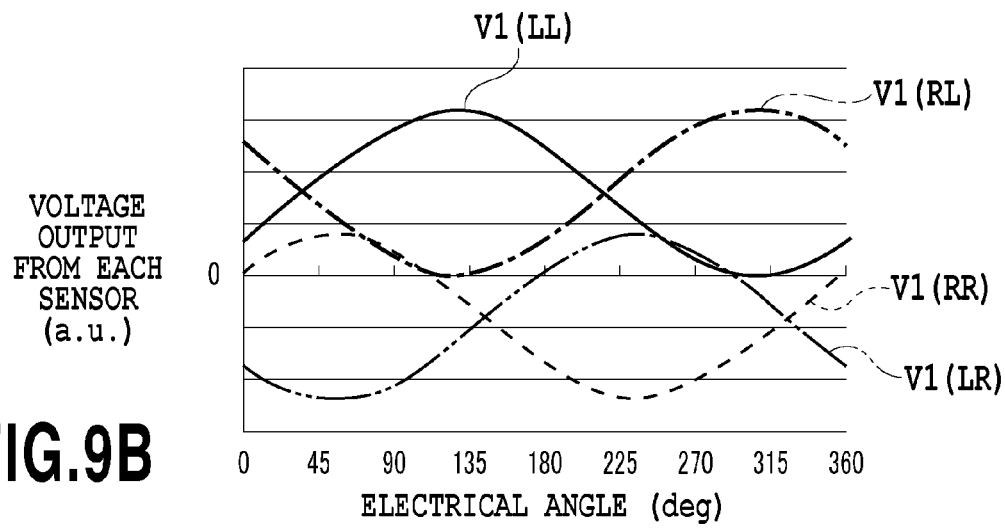
FIG. 9B is a diagram illustrating the results of signal calculation for one electrical angle period.
Figure 9C:
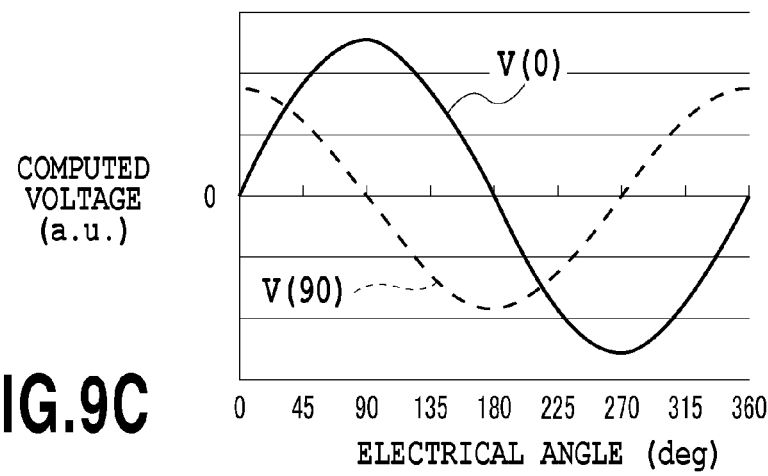
FIG. 9C is a diagram illustrating the results of signal calculation for one electrical angle period.
Figure 12B:
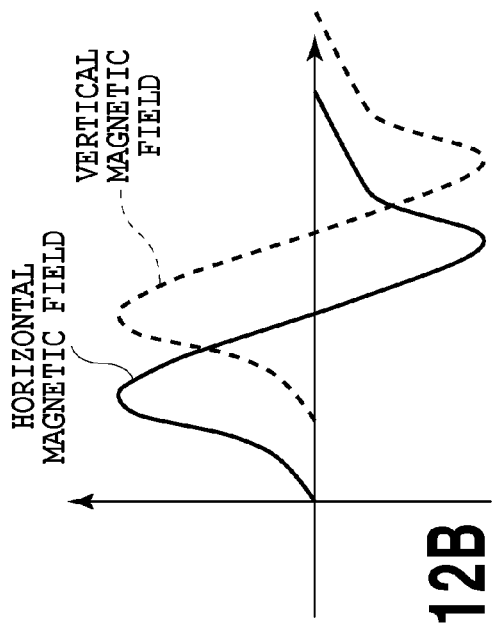
FIG. 12B is a diagram illustrating an example of a waveform in Examples 1, 2, and 3.
Figure 12D:
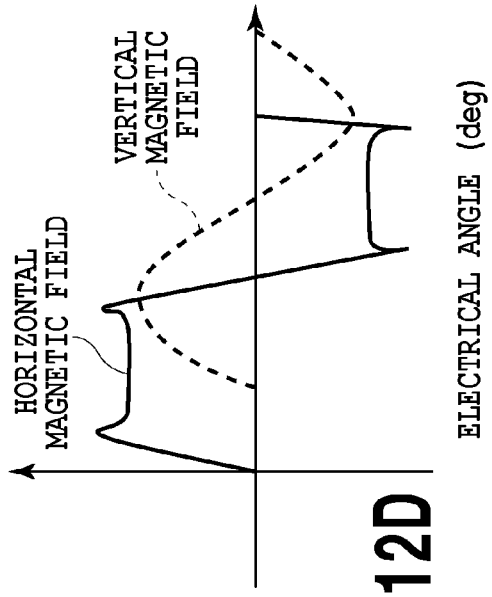
FIG. 12D is a diagram illustrating an example of a waveform in Examples 1, 2, and 3.
Figure 12A:
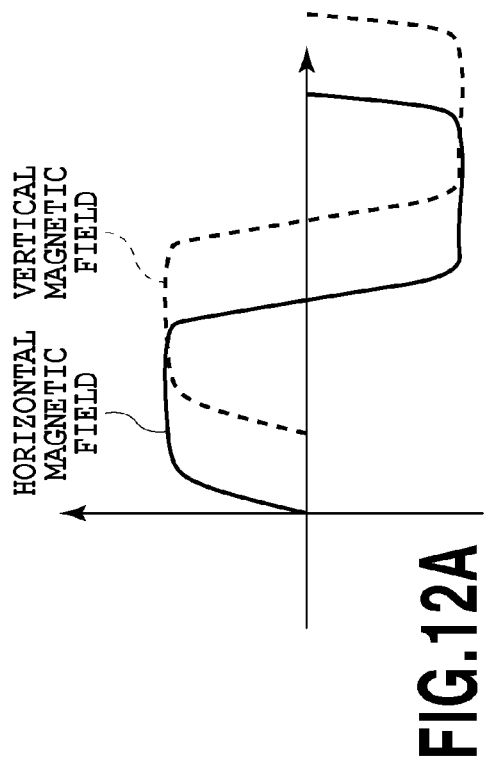
FIG. 12A is a diagram illustrating an example of a waveform in Examples 1, 2, and 3.
Figure 12C:
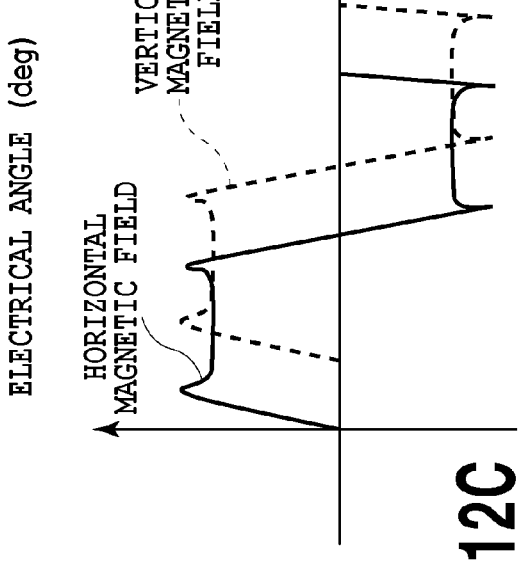
FIG. 12C is a diagram illustrating an example of a waveform in Examples 1, 2, and 3.

FIGS. 9A to 9C are diagrams illustrating the results of signal computation for one period of the electrical angle. In the notation in FIG. 9, since the magnetic field strength changes greatly according to the size and shape of the magnet, the gap between the sensor and magnet, the magnetization method for the magnet, and the like, the units for the respective magnetic flux densities and output voltages are expressed as a.u. (arbitrary units) in the present example. This is not problematic for the case of explaining the present example.

FIG. 9A expresses the change in the horizontal/vertical magnetic flux density applied to the magnetic magneto-sensing unit centers 11 and 12 of the sensor units 9 and 10, while FIG. 9B expresses the output voltage from each Hall element, and FIG. 9C expresses the computed V(0) and V(90). In the case of no magnetic noise disturbance, the magnetic flux densities in the horizontal/vertical directions applied to each sensor unit center become an approximate sine wave shape or an approximate cosine wave shape centered on 0. Although not illustrated, there also exists the case in which noise is applied for just an arbitrary time in one period.

At this point, a review of FIG. 9C demonstrates that the computed signals V(0) and V(90) in FIG. 6, although differing in amplitude, have a phase difference of 90 degrees with respect to each other. Utilizing this phase difference enables detection of the rotational direction. Also, it is furthermore demonstrated that the effects of magnetic noise disturbance included in FIG. 9A are eliminated from the signals V(0) and V(90), yielding sine wave shape and cosine wave shape signals with no offset.

As a result, it is demonstrated that the signals V(0) and V(90) obtained in Eqs. 17 and 18 cancel magnetic noise disturbance due to the phases mutually differing by a phase of 90 degrees, and indicate output voltages in which only the magnet-produced magnetic field signals are amplified. Also, with the shape herein (depicted in FIG. 3, magnetic convergence plate z direction thickness of 30 μm), magnetic simulation results yield a K of approximately 7.3 times, and the phase difference a discussed earlier becomes approximately 60 degrees. For this reason, if stated in terms of Eq. 17, the horizontal magnetic field with respect to the sensor surface due to the magnetic convergence plates becomes 6.3 times (7.3×cos(30°)) (where the vertical magnetic field amplification rate K' is approximately 1.2) as the actual magnetic flux density. However, although the case of the magnetic convergence plate shape herein yields the parameters discussed above, modifying this shape as in FIGS. 16 and 17 enables adjustment of the parameter K cos(α/2) within a range of 0<K cos(α/2)<10 for a magnet pitch of 2 mm, and it is sufficient for a user to consider a magnitude therewithin and specify an optimal parameter. From the example herein, if a large parameter is used for K cos(α/2), it is possible to obtain an extremely large S/N compared to a Hall element alone. For this reason, jitter due to output circuit noise may be significantly reduced.

Specifically, with recent silicon semiconductor technology, if output jitter of approximately 0.5% for B0=0.35 mT is demanded, then approximately K cos(α/2)>3.6 (with a cutoff frequency of 5 kHz) becomes the necessary condition, and this obviously may be set appropriately according to user demand.

Next, specific signal processing of the obtained signals V(0) and V(90) will be discussed.

The signal amplification units 51 are signal amplification units having an auto gain control function that amplifies an input waveform up to near a designated output. The signal comparison units 52 are signal comparison units configured with a hysteresis comparator or the like for converting an analog input waveform into a digital pulse output while preventing comparator chattering. The signal computation unit 53 includes functions such that, in the case of detecting the rising or falling edge in the output of one of the signal comparison units 52, it is possible to observe the output state of the other and determine the rotation direction. The signal computation unit 53 has binary rotation direction information and edge switch timing information as output. The output formation unit 54 creates an output pulse waveform on the basis of the output of the signal computation unit 53. The output unit 55 is a driver.

Next, the signal flow in FIG. 6 will be used to describe signal processing.

Signals of V(0) and V(90) indicated in Eqs. 17 and 18 obtained up to the output of the third subtraction block and the fourth subtraction block are respectively input into the signal amplification units 51a and 51b, and the amplified output signals are respectively input into comparators with hysteresis (signal comparison units) as in FIG. 10A, and compared signals are outputs as in FIG. 10B. Herein, Vref1 and Vref2 in FIG. 10B are the threshold values of the hysteresis comparators. The reason for using hysteresis comparators herein is in order to prevent circuit noise-induced chattering in the output by providing hysteresis.

In Embodiment 1, the threshold values of the hysteresis comparators in the signal comparison unit 52a and the signal comparison unit 52b are taken to be the same.

Also, the outputs from the signal comparison units 52a and 52b are input into the comparison computation unit 53. In the comparison computation unit 53, a digital signal is created with a command causing the output unit to output a pulse with given time information every time the output of the signal comparison unit 52a switches state from high to low or from low to high (preferably created using V(0), which is the magnetic field information signal in the horizontal direction with respect to the Hall element magneto-sensing surface, and which is magnetically amplified with improved S/N by the magnetic convergence plates), which is output to the output formation unit 54. At this point, in the comparison computation unit 53, the output state of the signal comparison unit 52a is checked when triggered by the rising or falling of the output of the signal comparison unit 52b as discussed above, the rotational direction is determined accordingly, and the content is output to the output formation unit, and controlled to become a designated output in the output formation unit. Specifically, the time in the high state during a pulse period is varied and output according to the rotational direction discussed above as in FIG. 11 (t1 and t2 differ in FIG. 11). At this point, although not illustrated, a technique of varying the time in the low state and outputting a rotational direction may also be taken. Also, although in the present example rotation information is added to the final pulse output that is output every applied magnetic field period, outputting only a rotational information signal from a separate output pin (for example, a high state if the rotational direction is counter-clockwise, and a low state if clockwise), for example, is also implementable.

Also, in the case of not including rotational direction output in the output, inputting the output values of the hysteresis comparators directly into the output unit is also implementable. Also, obviously it is also possible to detect position at high resolution (double resolution) by taking the exclusive logical OR between the output of the signal comparison units 52a and 52b.

Also, the present example has illustrated the case of using an ideal multipolar magnet with no uneven magnetization or the like, in which ample spacing is provided between magnet and sensor such that an ideal sine wave or cosine wave magnetic field is applied to the sensor in conjunction with the rotation of the magnet. However, as the distance between sensor and magnet gets closer, distortion is produced due to the magnetic signal applied to the sensor becoming different from an ideal sine wave or cosine wave. Also, the phase difference between the horizontal-direction magnetic field and the vertical-direction magnetic field may no longer be 90° in some cases due to factors such as the effects of a magnetic body close to the sensor module or the effects of uneven magnetization. Even in such cases, with the example discussed above, unproblematic implementation is possible, and magnetic noise disturbance elimination is also possible. Furthermore, a pure magnetic field signal from a magnet has two zero-crossing points, and in the case of having a roughly odd function centered on those zero-crossing points, usage with no problems whatsoever is possible in actual use. Examples of a waveform in the case of a distorted signal applied to the sensor from the magnet will now be given.

FIGS. 12A to 12D are diagrams illustrating an example of waveforms in Examples 1, 2, and 3. Even under such magnetic field conditions, and neither limited thereto, unproblematic implementation is possible. Also, in the present example, the magnet pitch is matched to the distance between the magnetic magneto-sensing unit centers of the sensors, enabling the sensors to process applied magnetic field signals with a 180 degree phase difference. However, in the case where the magnet pitch and the distance between the magnetic magneto-sensing unit centers of the sensors units are not matched, a magnetic field like the following will be applied to the magnetic magneto-sensing unit centers.

[Math. 6]

$$B_\perp(9) = -B'0 \times \cos(\theta+\beta) + Bz\text{offset}(t) \quad (19)$$

$$B_\perp(10) = B'0 \times \cos(\theta-\beta) + Bz\text{offset}(t) \quad (20)$$

$$B_\diamond(9) = B0 \times \sin(\theta+\beta) + Bx\text{offset}(t) \quad (21)$$

$$B_\diamond(10) = -B0 \times \sin(\theta-\beta) + Bx\text{offset}(t) \quad (22)$$

Herein, β is the phase difference induced by a mismatch between the distance B between the magnetic magneto-sensing unit centers of the sensor units, and the magnet pitch distance A. In terms of a specific example, in the case where the distance between the magnetic magneto-sensing unit centers of the sensor units is 1.6 mm and the magnet pitch is 2 mm, β becomes 180/2×(2−1.6)/2=18 degrees. Herein, Eq. 19 expresses the vertical magnetic field at the sensor surface input into the sensor unit 9, Eq. 20 expresses the magnetic field at the sensor surface input into the sensor unit 10, Eq. 21 expresses the horizontal magnetic field at the sensor surface input into the sensor unit 9, Eq. 22 expresses the horizontal magnetic field at the sensor surface input into the sensor unit 10, B0 expresses the vertical magnetic field amplitude output by the ring magnet 16, B'0 expresses the horizontal magnetic field amplitude output by the ring magnet 16, Bzoffset(t) expresses the magnetic field disturbance (magnetic noise) in the z direction at a given time, and Bxoffset(t) expresses the magnetic field disturbance (magnetic noise) in the x direction at a given time.

V(0) and V(90) in the state where such a magnetic field is applied become like the following formulas.

[Math. 7]

$$V(0) = 4CKB0\sin\theta\cos\left(\frac{\alpha}{2}\right)\cos\beta \quad (23)$$

$$V(90) = 4C\left(KB0\sin\left(\frac{\alpha}{2}\right) + K'B'0\right)\cos\theta\cos\beta \quad (24)$$

For this reason, the case where a phase difference induced by a mismatch between the distance B between the magnetic magneto-sensing unit centers of the sensor units and the magnet pitch distance A occurs is expressed in the form of multiplication by a cosine. Consequently, in the case where a sufficient magnetic field is applied, unproblematic usage is possible even in the case where the phase of the pitch discussed above differs.

Also, although the magnetic magneto-sensing unit centers are preferably on the XY plane on the circle 19 constituted by the midpoint of the inner diameter and the outer diameter of the multipolar ring magnet, some variation due to structural misalignment in the position of the magnetic magneto-sensing unit centers obviously poses no problem as along as the configuration is within the magnetic flux density range to use, although there will be the phase change effects as discussed regarding Eqs. 23 and 24 and the adverse effect of a reduction in the input magnetic flux density. Also, although the present example has been described with a ring magnet, obviously a shape other than a ring magnet, such as a magnet in which two or more poles are magnetized on the outer circumference of a cylinder, for example, is also implementable.

Figure 13B:
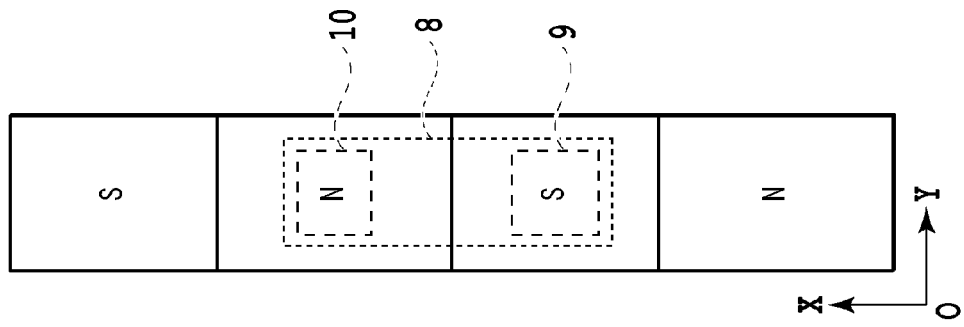
FIG. 13B is a side view for explaining another example of a magnetic field measuring device in Embodiment 1.
Figure 13A:
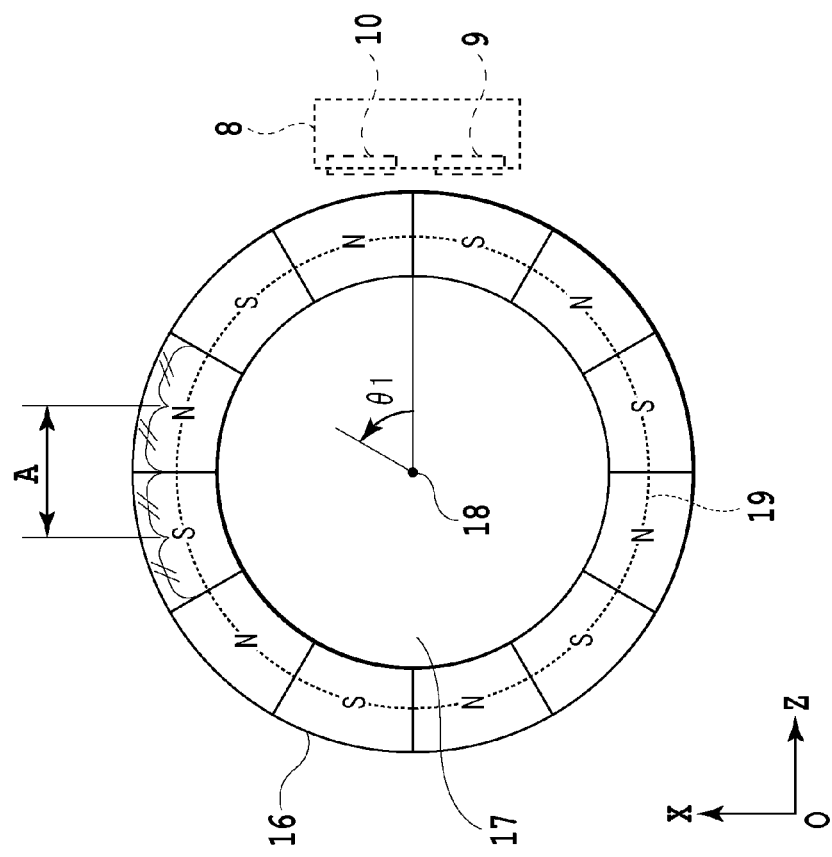
FIG. 13A is a top view for explaining another example of a magnetic field measuring device in Embodiment 1.

Also, although in this example the sensor placement is as in FIGS. 7 and 8, configurations placed on the side face of the magnet as in FIG. 13 obviously pose no problem. Also, the signal comparison units 52*a* and 52*b*, the comparison computation unit 53, and the output formation unit 54 in FIG. 6 obviously are do not depend on either analog processing or digital processing.

Also, the multipolar magnet described in this example obviously does not depend on a material such as ferrite, neodymium, or samarium-cobalt, or on formation such as sintering or bonding.

Although the signal comparison unit 51*a* and the signal comparison unit 51*b* or the signal comparison unit 52*a* and signal comparison unit 52*b* in FIG. 6 discussed above are preferably equipped with an input signal offset canceling circuit, the configuration is not necessarily limited thereto, insofar as the required duty demands are satisfied. Also, while the signal amplification units 51*a* and 51*b* preferably have an auto gain control function enabling a variable signal amplification rate according to the magnitude of the input signal as introduced in the present example, this function is not a requirement.

Also, according to the present invention, by using Hall elements formed on the same IC and having nearly equal temperature properties, the output phase becomes output with no temperature dependency.

Also, although the sensor configuration discussed above uses four Hall elements, obviously usage is still possible even with four or more Hall elements.

Also, although in the present example the magnetic convergence plate shape is shaped as in FIG. 3, obviously shapes such as those in FIGS. 16A to 16H and FIGS. 17A to 17C are also acceptable.

Also, although the present example has been described using a 12-pole multipolar magnet, it is sufficient for the distance between the magnetic magneto-sensing unit centers of the respective sensor units (taken to be 2 mm in the present example) to roughly match the magnetized pitch of the multipolar magnet. In other words, the present invention is implementable irrespective of the number of poles.

Also, although the distance between the magnetic magneto-sensing unit centers of the respective sensor units has been described as 2 mm, it is sufficient for this numerical value to match the magnetized pitch of the multipolar magnet in use, and may be modified in any way.

Embodiment 1 proposes a rotational detection device able to detect a rotational direction, and also capable of inputting a magnetic field amplified by the magnetic-concentrating effect of magnetic convergence plates into Hall elements, which realizes lower jitter in the output and higher sensitivity of the sensor due to a high S/N, and is furthermore able to effectively eliminate magnetic field disturbance (magnetic noise disturbance).

Meanwhile, provided that V1(LL)=E, V1(LR)=F, V1(RL)=G, and V1(RR)=H, Eq. 17 may be expressed as in the following Eq. 25. Additionally, if Eq. 25 is transformed, V(0) may be expressed by Eq. 26, for example.

$$V(0) = (E - F) - (G - H) \quad (25)$$

$$\begin{aligned}V(0) &= (E - F) + (H - G) \quad (26)\\ &= (E - G) + (H - F)\\ &= (E - G) - (F - H)\\ &= (E + H) - (F + G)\\ &= (E - F - G + H)\end{aligned}$$

Herein, in order to express the sum of E and F and the difference between E and (−F), for example, there is substantially no difference between a sum and a difference. Consequently, if Eq. 26 is transformed further, V(0) may be expressed by Eq. 27, for example.

$$\begin{aligned}V(0) &= (E + (-F)) + (H + (-G)) \quad (27)\\ &= (E + (-G)) + (H + (-F))\\ &= (E + (-G)) - (F + (-H))\\ &= (E - (-H)) - (F - (-G))\\ &= (E + (-F) + (-G) + H)\end{aligned}$$

For this reason, if Eqs. 25 to 27 are used, it is possible to express V(0) as the result of adding or subtracting the result of adding or subtracting E and F, and the result of adding or subtracting G and H. Also, it is possible to express V(0) as the result of adding or subtracting the result of adding or subtracting E and G, and the result of adding or subtracting F and H. Similarly, it is possible to express V(0) as the result of adding or subtracting the result of adding or subtracting E and H, and the result of adding or subtracting F and G, or alternatively, it is possible to express V(0) as the result of adding or subtracting the result of adding or subtracting E and F and G and H.

Similarly, with regard to V(90), it is possible to likewise express V(90) as the result of adding or subtracting the result of adding or subtracting E and F, and the result of adding or subtracting G and H. Also, it is possible to express V(90) as the result of adding or subtracting the result of adding or subtracting E and G, and the result of adding or subtracting F and H. Similarly, it is possible to express V(90) as the result of adding or subtracting the result of adding or subtracting E and H, and the result of adding or subtracting F and G, or alternatively, it is possible to express V(90) as the result of adding or subtracting the result of adding or subtracting E and F and G and H. However, the phase of V(0) and V(90) differs by 90 degrees.

The above reasons demonstrate that the first to fourth subtraction blocks and the first and second addition blocks illustrated in FIG. 6 may be substituted with first to sixth addition/subtraction blocks. FIG. 18 is a substitution of the first to fourth subtraction blocks and the first and second addition blocks illustrated in FIG. 6 with first to sixth addition/subtraction blocks. The first to third subtraction blocks 61 to 63 in FIG. 6 correspond to the first to third addition/subtraction blocks 81 to 83 in FIG. 18, while the first and second addition blocks 71 and 72 in FIG. 6 correspond to the fourth and fifth addition/subtraction blocks 84 and 85 in FIG. 18. The fourth subtraction block 73 corresponds to the sixth addition/subtraction block 86.

The first calculation block 91 in FIG. 18 is a grouping of the first addition/subtraction block 81, the second addition/subtraction block 82, and the third addition/subtraction block 83 into a single block, while the second calculation block 92 is a grouping of the fourth addition/subtraction block 84, the fifth addition/subtraction block 85, and the sixth addition/subtraction 86 into a single block. The first calculation block 91 outputs V(0), while the second calculation block 92 outputs V(90).

Note that in the first calculation block 91 in FIG. 18, the first addition/subtraction block 81 adds/subtracts the output of the first Hall element and the output of the second Hall element, while the second addition/subtraction block 82 adds/subtracts the output of the third Hall element and the output of the fourth Hall element. However, it is sufficient for the first addition/subtraction block 81 to add/subtract the outputs of two Hall elements from among the first to fourth Hall elements, and it is sufficient for the second addition/subtraction block 82 to add/subtract the outputs of the remaining Hall elements. This is also similar for the fourth addition/subtraction block 84 and the fifth addition/subtraction block 85.

Although the above describes the case in which there is a phase difference of 90 degrees between the output signal of the first calculation block 91 and the output signal of the second calculation block 92, the configuration is not limited to the case of a phase difference of 90 degrees, and it is sufficient for the output signal of the first calculation block 91 and the output signal of the second calculation block 92 to differ in phase. For example, the output signal of the first calculation block 91 and/or the output signal of the second calculation block 92 may be shifted in phase, and the phase difference may be set to a numerical value other than 90 degrees.

However, the case in which the output signal of the first calculation block 91 and the output signal of the second calculation block 92 have a phase difference of 90 degrees is most preferable, as this enables the most accurate detection of the position, move, or rotation of a magnetic field-producing body.

Embodiment 2

Figure 14:
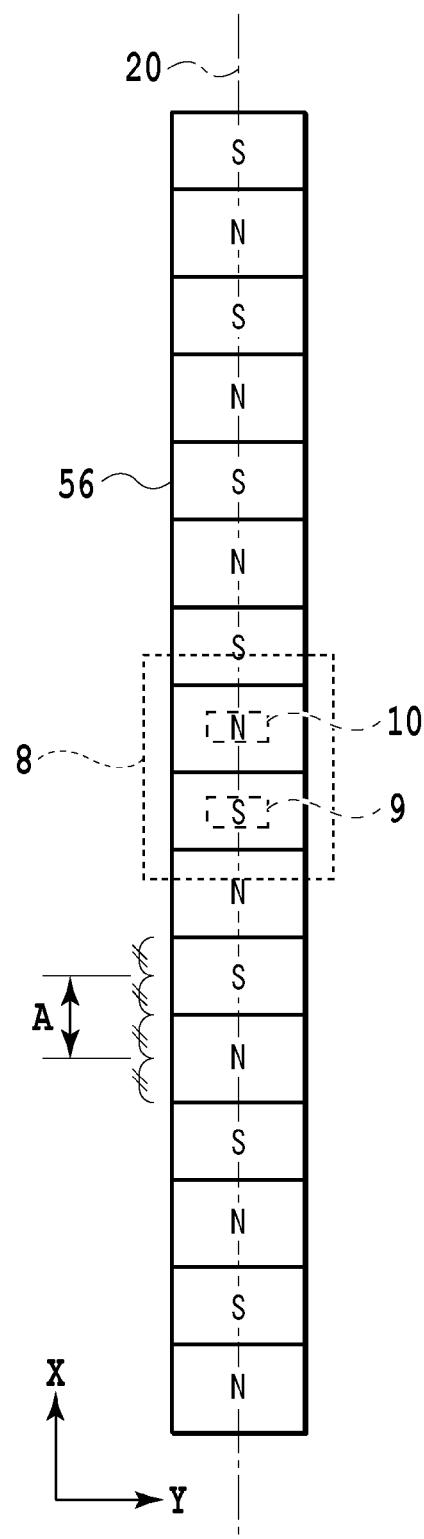
FIG. 14 is a top view for explaining a magnetic field measuring device in Embodiment 2.

Embodiment 2 according to the present invention relates to a magnetic field measuring device that detects the position of an object of position detection (an object of detection) using magnetoelectric transducers. Note that FIG. 3 discussed earlier illustrates a sensor configuration for explaining a magnetic field measuring device in Embodiment 2, FIG. 14 is a top view for explaining a magnetic field measuring device, FIG. 7 is a side view, and FIG. 6 is a block diagram for explaining signal processing. In Embodiment 2, since structural elements similar to Embodiment 1 are similar to those in Embodiment 1 except for cases in which such a structural element is particularly specified and described, the description thereof will be reduced or omitted.

FIGS. 7 and 14, which are schematic embodiment views of the present magnetic field measuring device, will be described. FIG. 14 is a top view for explaining a magnetic field measuring device in Embodiment 2, while FIG. 7 is a side view. The sign A illustrated in FIGS. 7 and 14 represents the pitch distance (2 mm in the present example) between an N pole and an S pole of a multipolar magnet. The sign 56 is a 16-pole straight-body multipolar magnet which is the object of position detection, and also moves in the Y direction of the object of position detection. Also, the placement of the sensor units 8 and 9 as well as the 16-pole straight-body multipolar magnet 59 illustrated in FIG. 14 is defined to be a moving magnitude of 0 mm. Also, the magnetic magneto-sensing unit centers are placed near the straight line 20 constituting the midpoint of the edge parallel to the x direction on the straight-body multipolar magnet 56.

In FIGS. 7 and 14, in the case where the 16-pole straight-body multipolar magnet 56 has no magnetic convergence plates, a magnetic field imparted to the magnetic magneto-sensing unit center 11 in the sensor unit 9 and the magnetic magneto-sensing unit center 12 in the sensor unit 10 may be approximated as sine waves/cosine waves according to [Math. 1] discussed in Embodiment 1, in conjunction with the move of the straight-body multipolar magnet 56 in the upwards direction of the page. In Embodiment 2, B=2 mm is set.

In Embodiment 2, similarly to the case of Embodiment 1, the vertical magnetic fields at the magneto-sensing surfaces applied to the Hall elements 1(LL), 1(LR), 1(RL), and 1(RR) respectively become like [Math. 2]. Also, similarly to the case of Embodiment 1, the voltage outputs V1(LL), V1(LR), V1(RL), and V1(RR) of the Hall elements 1(LL), 1(LR), 1(RL), and 1(RR) become like [Math. 3], and similarly, computing V2, V3, V4, and V5 becomes like [Math. 4]. Consequently, V(0) and V(90) as in FIG. 6 are obtained as in [Math. 5].

In Embodiment 2, signal processing similar to the case of Embodiment 1 is executed. In Embodiment 2, the threshold values of the hysteresis comparators in the signal comparison unit 52a and the signal comparison unit 52b are taken to be the same.

Although in the present example moving information is added to the final pulse output that is output every applied magnetic field period, outputting only a moving information signal from a separate output pin (for example, a high state if the moving direction is upward of the page in FIG. 14, and a low state if downward of the page), for example, is also implementable.

Also, in the case of not including moving direction output in the output, inputting the output values of the hysteresis comparators directly into the output unit is also implementable.

Also, in Embodiment 2, even under magnetic field conditions as illustrated in FIG. 12, and neither limited thereto, unproblematic implementation is possible. Also, in this case, the magnet pitch is matched to the distance between the magnetic magneto-sensing unit centers of the sensors, enabling the sensors to process applied magnetic field signals with a 180 degree phase difference. However, in the case where the magnet pitch and the distance between the magnetic magneto-sensing unit centers of the sensors units are not matched, a magnetic field like in [Math. 6] will be applied to the magnetic magneto-sensing unit centers, and V(0) and V(90) in a state in which such a magnetic field is applied become like [Math. 7].

Also, the signal comparison units 52a and 52b, the comparison computation unit 53, and the output formation unit 54 in FIG. 6 do not obviously depend on either analog processing or digital processing. Also, the ability to substitute the first subtraction block 61, the second subtraction block 62, the third subtraction block 63 and the first addition block 71, the second addition block 72, and the fourth subtraction block 73 in FIG. 6 with the first to sixth addition/subtraction blocks 81 to 86 is as discussed earlier.

Embodiment 2 proposes a magnetic field measuring device able to detect a moving direction, and also capable of inputting a magnetic field amplified by the magnetic-concentrating effect of magnetic convergence plates into Hall elements, which realizes lower jitter in the output and higher sensitivity of the sensor due to a high S/N, and is furthermore able to effectively eliminate magnetic field disturbance (magnetic noise disturbance).

Embodiment 3

Figure 15:
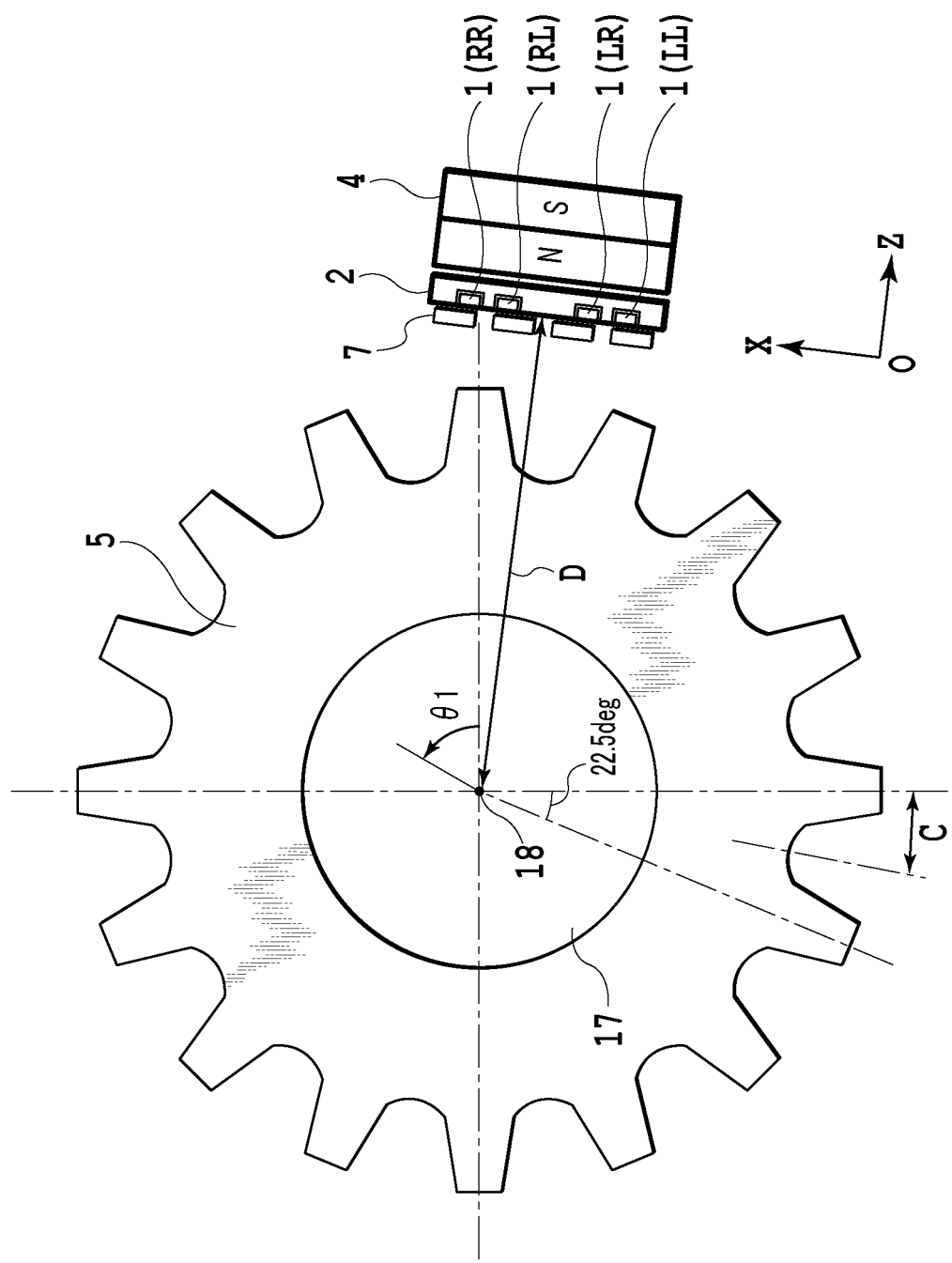
FIG. 15 is a top view for explaining a magnetic field measuring device in Embodiment 3.
Figure 16A:
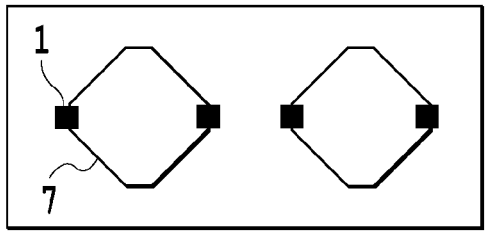
FIG. 16A is a diagram illustrating an example of a usable magnetic field convergence plate shape in Examples 1, 2, and 3.
Figure 16E:
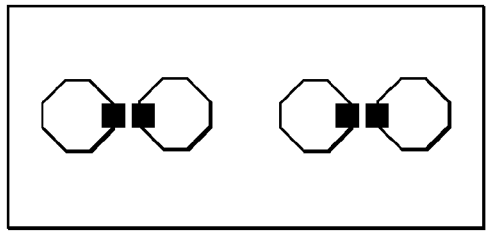
FIG. 16E is a diagram illustrating an example of a usable magnetic field convergence plate shape in Examples 1, 2, and 3.
Figure 16B:
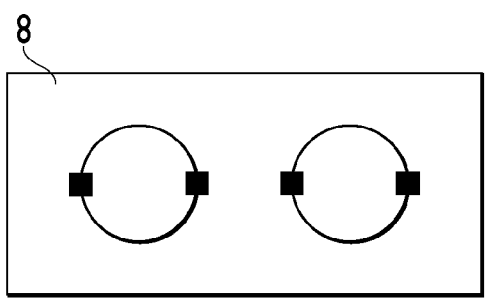
FIG. 16B is a diagram illustrating an example of a usable magnetic field convergence plate shape in Examples 1, 2, and 3.
Figure 16F:
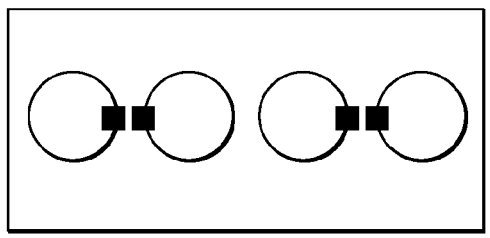
FIG. 16F is a diagram illustrating an example of a usable magnetic field convergence plate shape in Examples 1, 2, and 3.
Figure 16C:
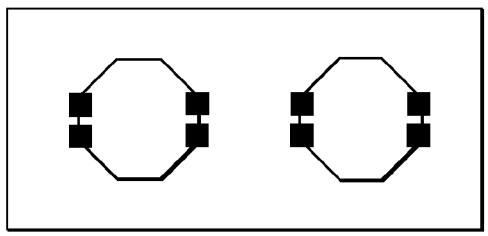
FIG. 16C is a diagram illustrating an example of a usable magnetic field convergence plate shape in Examples 1, 2, and 3.
Figure 16G:
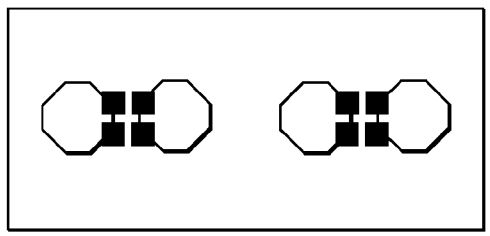
FIG. 16G is a diagram illustrating an example of a usable magnetic field convergence plate shape in Examples 1, 2, and 3.
Figure 16D:
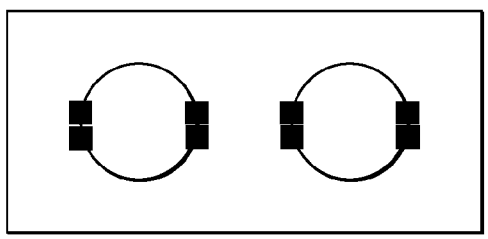
FIG. 16D is a diagram illustrating an example of a usable magnetic field convergence plate shape in Examples 1, 2, and 3.
Figure 16H:
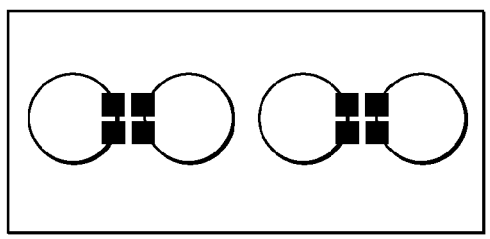
FIG. 16H is a diagram illustrating an example of a usable magnetic field convergence plate shape in Examples 1, 2, and 3.

Embodiment 3 according to the present invention relates to a magnetic field measuring device in the case where the object of rotation detection (an object of detection) is a gear made up of a magnetic body, and magnetoelectric transducers are used to detect. Note that FIG. 3 discussed earlier illustrates a sensor configuration for explaining a magnetic field measuring device in Embodiment 3, FIG. 15 is a side view for explaining a magnetic field measuring device, and FIG. 6 is a block diagram for explaining signal processing. In Embodiment 3, since structural elements similar to Embodiment 1 are similar to those in Embodiment 1 except for cases in which such a structural element is particularly specified and described, the description thereof will be reduced or omitted.

In the present example, the gear tooth pitch C (definition discussed later) is matched to the distance B between the magnetic magneto-sensing unit centers. Such a placement is configured in order to make different magnetic fields with 180 degree phase be input at the respective magnetic magneto-sensing unit centers.

Next, FIG. 15, which is a schematic embodiment view of the present magnetic field measuring device, will be described in detail.

FIG. 15 is a schematic embodiment side view of the present magnetic field measuring device. The sign 5 in FIG. 15 is a 16-tooth gear made up of a magnetic body, while the sign C expresses the pitch distance between the cogs and gaps of the gear (as a definition, in the case of taking D to be the distance from the rotational center 18 to the midpoint of the magnetic magneto-sensing unit centers 11 and 12, D×(22.5/2), using one electrical angle period of the gear 5, or in other words a mechanical angle of 22.5 degrees. With the gear in the present example, C is 2 mm.). Also, the sensor surface and the line segment from the rotational center 18 to the midpoint 21 of the respective magnetic magneto-sensing unit centers are installed approximately orthogonally. 4 is a back-bias magnet, 17 is the rotary shaft of the object of rotation, and θ1 is the rotational angle. Note that the rotational axis is parallel to the Z axis, and defined to rotate about the rotary shaft center 18. Also, the drawing currently expressed is defined to have a rotational angle of 0 degrees. In Embodiment 3, the rotary shaft 17 is taken to rotate counter-clockwise.

Also, the respective magnetic magneto-sensing unit centers are taken to be installed near the circumference (a circle of radius D from the center 18) constituted by the midpoint of gear tooth thickness (the Y axis direction FIG. 15).

In FIG. 15, in the case of no magnetic convergence plates, a magnetic field modulated by the back-bias magnet and the gear teeth may be approximated by sine waves and cosine waves as in [Math. 1] in conjunction with the rotation of the gear teeth at the magnetic magneto-sensing unit center of the sensor unit 9 and the magnetic magneto-sensing unit center of the sensor unit 10. The magnetic flux density discussed here is for the case of no magnetic convergence plates. Also, in the case of a gear like the present case, θ is the product θ=θ1×N of the rotational angle (mechanical angle) θ1 times the number of gear teeth N (in the present example, N=16).

In Embodiment 3, similarly to Embodiment 1, the vertical magnetic fields at the magneto-sensing surfaces applied to the Hall elements 1(LL), 1(LR), 1(RL), and 1(RR) respectively become like [Math. 2].

Herein, in Embodiment 3, the offset α from a phase difference of 180 degrees is produced because the magnetic flux density of the back-bias magnet 4 is modulated by the gear teeth 5 and the magnetic field produced in the x direction (horizontal direction) with respect to each sensor unit is non-uniform and not completely horizontal. This is greatly produced only for the horizontal magnetic field at the sensor surface. At this point, a slight phase offset is actually also produced in the vertical magnetic field, but is extremely small, and thus ignored in this description. Also, α is a constant determined by the size of the back-bias magnet, the size of the magnetic convergence plates, the size of the gear teeth, and their placement, including gaps.

In Embodiment 3, similarly to Embodiment 1, the voltage outputs V1(LL), V1(LR), V1(RL), and V1(RR) of the Hall elements 1(LL), 1(LR), 1(RL), and 1(RR) become like [Math. 3].

Similarly to Embodiment 1, by conducting computation of the sums and differences of the voltages obtained by [Math. 3] in the signal processing in FIG. 6, computing V2, V3, V4, and V5 becomes like [Math. 4], and V(0) and V(90) as in FIG. 6 are obtained like in [Math. 5].

The signal processing in Embodiment 3 is similar to the signal processing in Embodiment 1.

Also, the present example has illustrated the case of using an ideal gear shape with a uniform gear tooth shape, in which ample spacing is provided between back-bias magnet, gear, and sensor such that an ideal sine wave or cosine wave magnetic field is applied to the sensor in conjunction with the rotation of the gear 5. However, in Embodiment 3, even under magnetic field conditions as illustrated in FIG. 12, and neither limited thereto, unproblematic implementation is possible. Also, in this case, the magnet pitch is matched to the distance between the magnetic magneto-sensing unit centers of the sensors, enabling the sensors to process applied magnetic field signals with a 180 degree phase difference. However, in the case where the magnet pitch and the distance between the magnetic magneto-sensing unit centers of the sensors units are not matched, a magnetic field like in [Math. 6] will be applied to the magnetic magneto-sensing unit centers.

Herein, in Embodiment 3, β may be taken to be the phase difference induced by a mismatch between the distance B between the magnetic magneto-sensing unit centers of the sensor units, and the gear tooth pitch C. In terms of a specific example, in the case where the distance between the magnetic magneto-sensing unit centers of the sensor units is 1.6 mm and the gear tooth pitch C is 2 mm, β becomes 180/2×(2−1.6)/2=18 degrees. Herein, Eq. 19 expresses the vertical magnetic field produced at the sensor surface due to the magnetic flux density of the back-bias magnet 4 being modulated by the gear teeth, which is input into the sensor unit 9 in the case where the distance B between the magnetic magneto-sensing unit centers and the gear tooth pitch C do not match. Eq. 20 expresses the vertical magnetic field produced at the sensor surface due to the magnetic flux density of the back-bias magnet 4 being modulated by the gear teeth, which is input into the sensor unit 10 in the case where the distance B between the magnetic magneto-sensing unit centers and the gear tooth pitch C do not match. Eq. 21 expresses the horizontal magnetic field produced at the sensor surface due to the magnetic flux density of the back-bias magnet 4 being modulated by the gear teeth, which is input into the sensor unit 9 in the case where the distance B between the magnetic magneto-sensing unit centers and the gear tooth pitch C do not match. Eq. 22 expresses the horizontal magnetic field produced at the sensor surface due to the magnetic flux density of the back-bias magnet 4 being modulated by the gear teeth, which is input into the sensor unit 10 in the case where the distance B between the magnetic magneto-sensing unit centers and the gear tooth pitch C do not match. B'0 expresses the vertical magnetic field amplitude produced at the sensor surface due to the magnetic flux density of the back-bias magnet 4 being modulated by the gear teeth. B0 expresses the horizontal magnetic field amplitude produced at the sensor surface due to the magnetic flux density of the back-bias magnet 4 being modulated by the gear teeth.

V(0) and V(90) in a state in which such magnetic fields are applied become like [Math. 7], and for this reason, the case where a phase difference induced by a mismatch between the distance B between the magnetic magneto-sensing unit centers of the sensor units and the gear tooth pitch distance C occurs is expressed in the form of multiplication by a cosine.

Consequently, in the case where a sufficient magnetic field amplitude is applied, unproblematic use is possible even in the Also, although the respective magnetic magneto-sensing unit centers are preferably installed near the circumference (near the circle of radius D from the center 18) constituted by the midpoint of gear tooth thickness (the Y direction in FIG. 15), some variation due to structural misalignment in the position of the magnetic magneto-sensing unit centers obviously poses no problem as along as the configuration is within the magnetic flux density range to use, although there will be the phase change effects as discussed regarding Eqs. 23 and 24 and the adverse effect of a reduction in the input magnetic flux density amplitude. Also, although the present example has been described with gear teeth in a ring shape, obviously a shape other than gear teeth in a ring shape, such as a straight-moving gear (a rack), for example, may also be used.

Also, the signal comparison units 52a and 52b, the comparison computation unit 53, and the output formation unit 54 in FIG. 6 obviously do not depend on either analog processing or digital processing. Also, the ability to substitute the first subtraction block 61, the second subtraction block 62, the third subtraction block 63 and the first addition block 71, the second addition block 72, and the fourth subtraction block 73 in FIG. 6 with the first to sixth addition/subtraction blocks 81 to 86 is as discussed earlier.

Also, although a material such as neodymium or samarium-cobalt is desirable for the back-bias magnet described in the present example, obviously ferrite, alnico magnets, and the like may also be used.

Also, although in the present example the magnetic convergence plate shape is shaped as in FIG. 3, obviously shapes such as those in FIGS. 16A to 16H and FIGS. 17A to 17C are also acceptable.

Also, although the present example has been described using a 16-pole gear 5, it is sufficient for the distance between the magnetic magneto-sensing unit centers of the respective sensor units (taken to be 2 mm in the present example) to roughly match the magnetized pitch of the multipolar magnet. In other words, the present invention is implementable irrespective of the number of poles.

Also, although the distance between the magnetic magneto-sensing unit centers of the respective sensor units has been described as 2 mm, it is sufficient for this numerical value to match the gear tooth pitch of the gear in use, and may be modified in any way.

Embodiment 3 proposes a gear tooth rotational detection device able to detect a rotational direction, and also capable of inputting a magnetic field amplified by the magnetic-concentrating effect of magnetic convergence plates into Hall elements, which realizes lower jitter in the output and higher sensitivity of the sensor due to a high S/N, and is furthermore able to effectively eliminate magnetic field disturbance (magnetic noise disturbance).

The invention claimed is:

1. A magnetic field measuring device that detects the strength of a magnetic field produced from a magnetic field-producing body, comprising:
   first to fourth magnetoelectric transducers;
   magnetic convergence plates made up of a magnetic body; and
   a calculation unit that calculates the strength of a magnetic field applied in a horizontal direction and/or a vertical direction with respect to a magneto-sensing surface of the magnetoelectric transducers;
   wherein the magnetic convergence plates are placed in the vicinity of the first to fourth magnetoelectric transducers so as to
   convert magnetic field vectors produced in a horizontal direction with respect to the magneto-sensing surface of the first magnetoelectric transducer and the magneto-sensing surface of the second magnetoelectric transducer into magnetic field vectors in a vertical direction with respect to the magneto-sensing surface of the first magnetoelectric transducer and the magneto-sensing surface of the second magnetoelectric transducer, and also in opposite directions at the respective magneto-sensing surfaces, and further,
   convert magnetic field vectors produced in a horizontal direction with respect to the magneto-sensing surface of the third magnetoelectric transducer and the magneto-sensing surface of the fourth magnetoelectric transducer into magnetic field vectors in a vertical direction with respect to the magneto-sensing surface of the third magnetoelectric transducer and the magneto-sensing surface of the fourth magnetoelectric transducer, and also in opposite directions at the respective magneto-sensing surfaces, and
   wherein the calculation unit comprises a first calculation block that adds or subtracts outputs from the first to fourth magnetoelectric transducers to output a calculation result.

2. A magnetic field measuring device that detects the strength of a magnetic field produced from a magnetic field-producing body, comprising:
   first to fourth magnetoelectric transducers; and
   a calculation unit that calculates the strength of a magnetic field applied in a horizontal direction and/or a vertical direction with respect to a magneto-sensing surface of the magnetoelectric transducers;
   wherein the calculation unit comprises:
   a first calculation block that adds or subtracts outputs from the first to fourth magnetoelectric transducers to output a calculation result, and
   a second calculation block that adds or subtracts output from the first to fourth magnetoelectric transducers to calculate a signal whose phase differs by 90 degrees from an output signal of the first calculation block to output a calculation result.

3. The magnetic field measuring device according to claim 1, wherein the first calculation block comprises a first addition/subtraction block that adds or subtracts outputs from the first magnetoelectric transducer and the second magnetoelectric transducer to output a calculation result, a second addition/subtraction block that adds or subtracts outputs from the third magnetoelectric transducer and the fourth magnetoelectric transducer to output a calculation result, and a third addition/subtraction block that adds or subtracts output from the first addition/subtraction block and output from the second addition/subtraction block to output a calculation result.

4. The magnetic field measuring device according to claim 1, wherein the first calculation block comprises a first addition/subtraction block that adds or subtracts outputs from the first magnetoelectric transducer and the third magnetoelectric transducer to output a calculation result, a second addition/subtraction block that adds or subtracts outputs from the second magnetoelectric transducer and the fourth magnetoelectric transducer to output a calculation result, and a third addition/subtraction block that adds or subtracts output from the first addition/subtraction block and output from the second addition/subtraction block to output a calculation result.

5. The magnetic field measuring device according to claim 1, wherein the calculation unit comprises a second calculation block that adds or subtracts outputs from the first to fourth magnetoelectric transducers to calculate a signal whose phase differs from an output signal of the first calculation block.

6. The magnetic field measuring device according to claim 5, wherein the phase difference between an output signal from the first calculation block and an output signal from the second calculation block is 90 degrees.

7. The magnetic field measuring device according to claim 5, wherein the second calculation block comprises a fourth addition/subtraction block that adds or subtracts outputs from the first magnetoelectric transducer and the second magnetoelectric transducer to output a calculation result, a fifth addition/subtraction block that adds or subtracts outputs from the third magnetoelectric transducer and the fourth magnetoelectric transducer to output a calculation result, and a sixth addition/subtraction block that adds or subtracts output from the fourth addition/subtraction block and output from the fifth addition/subtraction block to output a calculation result.

8. The magnetic field measuring device according to claim 5, wherein the second calculation block comprises a fourth addition/subtraction block that adds or subtracts outputs from the first magnetoelectric transducer and the third magnetoelectric transducer to output a calculation result, a fifth addition/subtraction block that adds or subtracts outputs from the second magnetoelectric transducer and the fourth magnetoelectric transducer to outputs a calculation result, and a sixth addition/subtraction block that adds or subtracts output from the fourth addition/subtraction block and output from the fifth addition/subtraction block to output a calculation result.

9. The magnetic field measuring device according to claim 1, wherein the first to fourth magnetoelectric transducers are placed approximately linearly.

10. The magnetic field measuring device according to claim 1, wherein the calculation unit detects position, move, or rotation of the magnetic field-producing body.

11. The magnetic field measuring device according to claim 10, wherein the calculation unit detects position, move, or rotation of the magnetic field-producing body, on the basis of output from the first calculation block.

12. The magnetic field measuring device according to claim 10, wherein the calculation unit detects position, move, or rotation of the magnetic field-producing body, on the basis of a signal obtained by forming an output signal from the first calculation block into a pulse waveform.

13. The magnetic field measuring device according to claim 5, wherein the calculation unit detects position, move, or rotation of the magnetic field-producing body, on the basis of output from the first calculation block, and output from the second calculation block.

14. The magnetic field measuring device according to claim 1, comprising:
   a magnetic field-producing body;
   wherein the magnetic field-producing body is a movable and/or rotatable multipolar-magnetized magnet, or alternatively, a structure composed of a back-bias magnet installed in the vicinity of the first to fourth magnetoelectric transducers, and movable and/or rotatable gear teeth.

15. The magnetic field measuring device according to claim 1, comprising:
   a magnetic field-producing body;
   wherein the magnetic field-producing body is a structure composed of a back-bias magnet installed in the vicinity of the first to fourth magnetoelectric transducers, and movable and/or rotatable gear teeth, and
   the first to fourth magnetoelectric transducers are installed at positions between the back-bias magnet and the gear teeth.

* * * * *